US006330259B1

United States Patent
Dahm

(10) Patent No.: US 6,330,259 B1
(45) Date of Patent: Dec. 11, 2001

(54) MONOLITHIC RADIAL DIODE-PUMPED LASER WITH INTEGRAL MICRO CHANNEL COOLING

(76) Inventor: Jonathan S. Dahm, 940 Boston Ave., Longmont, CO (US) 80501

( * ) Notice: Subject to any disclaimer, the term of this patent is extended or adjusted under 35 U.S.C. 154(b) by 0 days.

(21) Appl. No.: 09/566,691

(22) Filed: May 8, 2000

Related U.S. Application Data
(60) Provisional application No. 60/140,922, filed on Jun. 24, 1999, provisional application No. 60/140,923, filed on Jun. 24, 1999, provisional application No. 60/140,921, filed on Jun. 24, 1999, provisional application No. 60/176,564, filed on Jan. 18, 2000, provisional application No. 60/176,703, filed on Jan. 18, 2000, provisional application No. 60/176,564, filed on Jan. 18, 2000, provisional application No. 60/176,599, filed on Jan. 18, 2000, and provisional application No. 60/140,922, filed on Apr. 10, 2000.

(51) Int. Cl.$^7$ .............................. H01S 3/04; H01S 3/0941
(52) U.S. Cl. ................................. 372/35; 372/36; 372/75
(58) Field of Search .................................. 372/35, 36, 75

(56) References Cited

U.S. PATENT DOCUMENTS

| | | | |
|---|---|---|---|
| 3,686,543 | * 8/1972 | Nyul | 372/75 |
| 4,716,568 | 12/1987 | Scifres et al. | 372/36 |
| 5,033,058 | 7/1991 | Cabaret et al. . | |
| 5,040,187 | 8/1991 | Karpinski . | |
| 5,128,951 | 7/1992 | Karpinski . | |
| 5,291,504 | 3/1994 | Bournes . | |
| 5,353,708 | 10/1994 | Stavrev et al. | 102/301 |
| 5,394,426 | 2/1995 | Joslin | 372/50 |

(List continued on next page.)

FOREIGN PATENT DOCUMENTS

WO 98/52258  11/1998  (WO) .............................. H01S/3/091

OTHER PUBLICATIONS

Patent Cooperation Treaty PCT International Search Report, RM467a, PCT/US00/17614, Jun. 23, 2000, Jun 24, 1999, Dahm, Johnathan S.

"Focusing of Diode Lasers for High Beam Quality in High Power Applications" Peter Albers et al. pp. 533–538, 1992 (No Month) SPIE vol. 1780 Lens and Optical Systems Design.

"High Performance Liquid Cooled Aluminum Nitride Heat Sinks" R. Hahn et al. pp. 21–26, 16/1 (1999), (No Month) Microelectronics Internatioanl.

"Incipient boiling characteristics and Subatmospheric Pressures" K.A. Joudi, pp. 398–403, Transactions of the ASME Journal of Heat Transfer, Aug. 1977, vol. 99.

"Liquid Cooling for a Multichip Module using Fluorinert Liquid and Paraffin Slurry" Mingoo Choi, Keumnam Cho, International Journal of Heat and Mass Transfer 43 (2000) pp. pp. 209–218 (No Month).

(List continued on next page.)

Primary Examiner—James W. Davie
(74) Attorney, Agent, or Firm—Rick Martin; Patent Law Offices of Rick Martin, P.C.

(57) ABSTRACT

A laser device includes a laser rod; a radial array of diode laser pumping devices, wherein each diode laser has a solid connection to the laser rod to maximize laser energy transfer. The diode laser radial array is serially connected via coatings and/or fingers and/or spheres. Cooling of the laser rod and the diode laser radial array is accomplished via a common fluid channel outside the laser rod, wherein a cooling fluid flows past the laser rod and the diode laser radial array. Innovative methods for creating the coating embodiments are disclosed. Various flat diode laser embodiment are also disclosed.

11 Claims, 26 Drawing Sheets

U.S. PATENT DOCUMENTS

| | | | |
|---|---|---|---|
| 5,471,491 | * 11/1995 | Phillips et al. | 372/35 |
| 5,521,936 | 5/1996 | Irwin . | |
| 5,627,850 | 5/1997 | Irwin et al. . | |
| 5,778,020 | * 7/1998 | Gokay | 372/75 |
| 5,870,421 | 2/1999 | Dahm | 372/75 |

OTHER PUBLICATIONS

"Microoptical Beam Transformation System for High–Power Laser Diode Bars with Efficient Brightenss Conservation" Rolf Goring et al. SPIE vol. 3008, pp. 202–210, (No Month).

"Performance and Lifetime of High–Power Diode Lasers and Diode Laser Systems" Friedhelm Dorsch SPIE vol. 3628, pp. 56–63 (No Month).

"Thermal Conductivity of Nanoparticle—Fluid Mixture" Xinwei Wang, Xianfan Xu, Journal of Thermophysics and Heat Transfer, vol. 13, No. 4, Oct.–Dec. 1999, pp. 474–480.

"Two–Phase Electronic Cooling Using Mini–Channel and Micro–Channel Heat Sinks: Part 1—Design Criteria and Heat Diffusion Constraints" Morris B. Bowers Transactions of the ASME pp. 290–297 vol. 116 Dec. 1994.

"Two–Phase Electronic Cooling Using Mini–Channel and Micro–Channel Heat Sinks: Part 2—Flow Rate and Pressure Drop Constraints" Morris B. Bowers Transactions of the ASME, pp. 298–305, vol. 116 Dec. 1994.

Laser Diode Arrey, Inc. "Pump Donuts" www.lddi.com (No Date).

Metron Optics, Inc. : "Super 3D" Monoscope (No Date).

Metron Optics, Inc. : 3D Video Endoscope (Mar. 7, 1999).

Dymax Corporation: OP–30 and OP–32 Low Stress, Flexible, Clear, High Performance Optical Adhesives (Dec. 1999).

Dymax Corporation: Adhesive Features and Benefits http://www.lymax.com/products/optical/selector.htm (Feb. 8, 2000).

Electronic Materials, Inc.: Optocast 3415, UV and/or Heat Curable One Epoxy (Feb. 2000).

Electron Materials, Inc.: Opocast, UV Curved Epoxies for Optical Uses, Optocast (No Date).

* cited by examiner

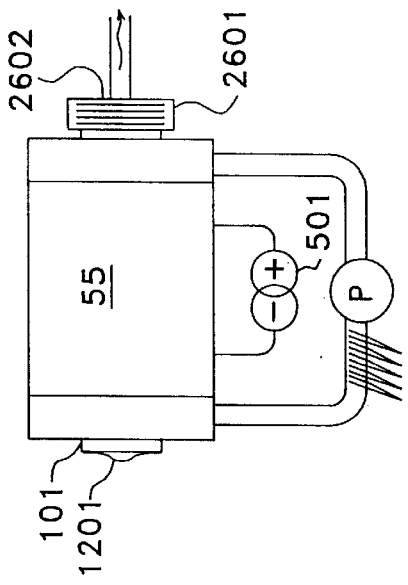
FIG.26
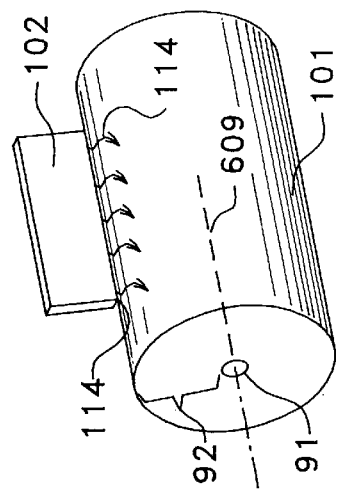
FIG.25
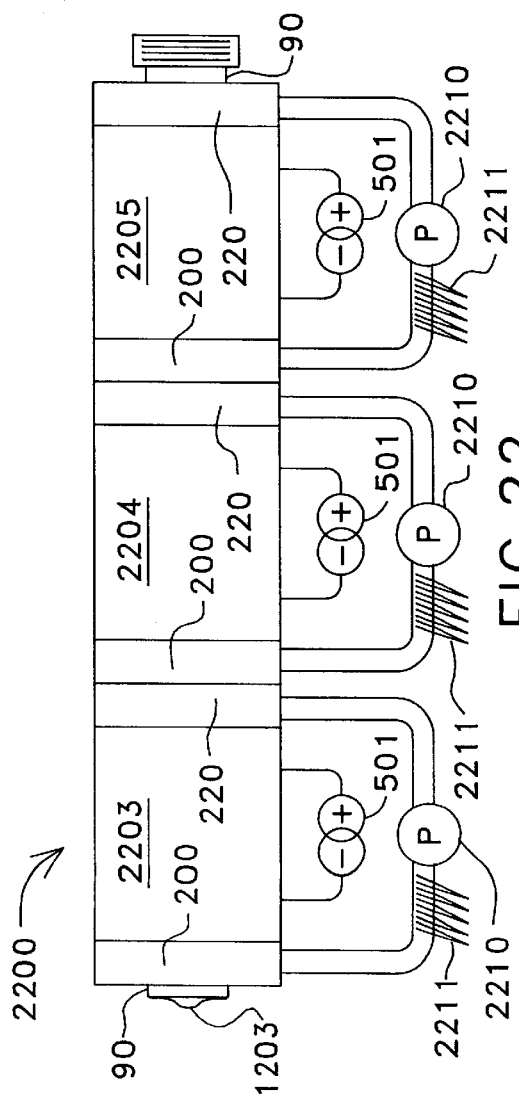
FIG.22
FIG.23

MONOLITHIC RADIAL DIODE-PUMPED LASER WITH INTEGRAL MICRO CHANNEL COOLING

CROSS-REFERENCE TO RELATED APPLICATIONS

This application is a non-provisional application claiming the benefits of the following provisional applications:

This application is a non-provisional application claiming the benefits of provisional application no. 60/140,922 filed Jun. 24, 1999 titled "Modulation of Light by an Electrically Tunable Multi-layer Interference Filter or Photonic Crystal for Cavity Dumping a Laser".

This application is a non-provisional application claiming the benefits of provisional application no. 60/140,923 filed Jun. 24, 1999 titled "Radially Side-Pumped Laser Heads using Electrolessly Plated Microspheres for Enhanced Cooling".

This application is a non-provisional application claiming the benefits of provisional application no. 60/140,921 filed Jun. 24, 1999 "Laser Diode Arrays with Individually Cooled Bars Using Metal Spheres (or Diamond) and Electroplating or Electroless".

This application is a non-provisional application claiming the benefits of provisional application no. 60/176,564 filed Jan. 18, 2000 titled "Radially Side-Pumped Laser Heads with Micro Channels and Nano or Pico Sized Particulate Containing Water Based Coolants for Enhanced Cooling."

This application is a non-provisional application claiming the benefits of provisional application no. 60/176,703 filed Jan. 18, 2000 tilted "Radially Side-Pumped Laser Heads using easily Manufactured Micro Channels for Enhanced Cooling."

This application is a non-provisional application claiming the benefits of provisional application no. 60/176,564 filed Jan. 18, 2000 tilted "Radially Side-Pumped Laser Heads with Micro Channels and Nano or Pico Sized Particulate Containing Water Based Coolants for Enhanced Cooling."

This application is a non-provisional application claiming the benefits of provisional application no. 60/176,599 filed Jan. 18, 2000 titled "Nano or Pico Sized Particles in Water for Enhanced Cooling of Laser Diode Arrays with Micro or Mini Channels."

This application is a non-provisional application claiming the benefits of provisional application no. 60/140,922 filed Apr. 10, 2000 titled "Monolithic radial layer diode array and solid-state laser with inserts that define micro flow channels and electrical path between diodes."

FIELD OF THE INVENTION

This invention relates generally to solid-state lasers and more specifically to a high power semiconductor laser diode pumped package that provides efficient coupling to a laser rod and integrates cooling of laser diode arrays and the laser rod.

BACKGROUND OF THE INVENTION

High-power laser diode packages and diode-pumped solid-state lasers are commonplace on the laser market. Diode bars consisting of 1–100 individual light-emitting stripes produce output power up to hundreds of watts under continuous-wave operation and higher peak powers in pulsed operation. A difficulty exists in efficiently coupling the light emitted from these high power laser diode arrays into a laser rod due to the inherent asymmetry of the laser diode output beam. Additionally, effective waste heat removal from both the diode arrays and the laser rod is very difficult in small, compact packages. Therefore, low thermal resistance and high heat transfer to the coolant is very desirable. Low thermal resistance values result in low diode operating temperature and longer diode lifetime as well as avoiding deleterious wave front distortions in the laser rod. Diode-pumped solid-state lasers in the prior art require two separate cooling loops for the diode arrays and the laser rod. This adds size as well as complexity to the overall package, which is a detriment when weight or optical cavity length issues are a consideration. Some prior art laser diode packages use micro channel cooling and some prior art rod laser designs use a small flow channel around the rod, but to our knowledge no prior art combines micro channel cooling of both the laser rod and diodes in one cooling loop. This is accomplished in the instant invention because the diodes are mounted to the laser rod using a transparent polymer adhesive, resulting in a monolithic or integrated structure, which is then easy to cool as a unit. In the prior art as well as the instant invention it is much more important to accurately control the temperature of the diodes by controlling the coolant temperature than it is to control the temperature of the laser rod, as the diode's output wavelength is temperature dependent. The rod's refractive index varies radially with the temperature as the heat flows from the center of the rod to the periphery, and this gradient slope changes very little in the operating temperature region of the diodes. Therefore, they can be cooled together with the same coolant. U.S. Pat. No. 5,521,936 to Irwin, issued May 28, 1996, discloses a laser device with a cooling tube around the laser rod and a separate sleeve surrounding the diode array that defines a coolant channel for cooling the diode array. U.S. Pat. No. 5,627,850 to Irwin, issued May 6, 1997, discloses a laser diode array but makes no mention of integrating the cooling of a laser rod with the laser diode array. Additionally, a key aspect of the invention is the use of a very high temperature (+1,000° C.) ceramic/copper direct bond process, whereas the instant invention uses a room temperature UV bonding process.

SUMMARY OF THE INVENTION

The present invention, a diode—pumped solid state laser called the "Laser Cube™", is as versatile as it is revolutionary! From a couple of watts to multi-hundreds of watts, the "Laser Cube™" delivers performance and cost benefits that were heretofore deemed impossible. By creating a laser with the pump diode and gain media functioning as one, instead of disparate units, the "Laser Cube™" pushes efficiency, beam quality, end power data points to extreme levels while maintaining an ultra compact and cost effective package. This breakthrough, technology offers the following features and Benefits:

| | |
|---|---|
| Ultra Compact (1 cm3) and Lightweight (<3 g) | The miniature and lightweight "Laser Cube ™" can be of benefit to laser marking, and robotic fiberless processes, as well as many other industrial, medical, military, and telcom applications. OEM users will appreciate the ease with which the "Laser Cube ™" can be integrated into current designs. |

-continued

| | |
|---|---|
| High Power and High Beam Quality | High power does not have to come at the expense of beam quality! Homogeneous pump distribution as well as advanced cooling technology results in superior beam quality. |
| Extremely Efficient Micro-Channel Cooling of Both Laser Diodes and Gin Medium | Exceedingly low thermal resistance results in both long diode life and excellent beam quality due to low thermally induced wavefront distortions. |
| Extremely Efficient Utilization of Pump Energy Without Focusing Lenses | The "Laser Cube ™" is a close-coupled, radially side-pumped design with integral diode/rod/reflector construction. This results in an extremely efficient laser with low scattering and reflection losses. |
| Very Low Parts Count With Simple Manufacturing Techniques | Novel room temperature assembly techniques results in a production friendly package with low manufacturing costs repeatable performance, and high yields. |
| Ultra-Short Cavity length | With a cavity length of 13 mm or less, ultra-short pulsed Q-switched and cavity dumped lasers are possible due to the short photon round trip time. |

According to the present invention, a laser diode bar or bar's comprising a plurality of individual laser diode stripes are radially displaced, around a laser rod or gain medium where the longitudinal length (or array axis) of the laser diode bar is aligned along a major axis of the laser rod. The present invention integrates the pump diode's, laser rod, and reflector in a close-coupled, radially side-pumped construction for very efficient and homogeneous deposition of the pump energy into the central region of the laser rod, without focusing lenses. This integrated packaging results in a laser with low scattering and reflection losses. A unique cooling method is further integrated into the invention and is based on contiguous micro channel cooling of both the laser diode and laser rod. The invention is assembled as a monolithic unit at room temperature using UV adhesive technology that can be easily automated for robotic assembly. The unique packaging of the laser results in minimal parts count and further adds to a production-friendly package. The miniature size of one cubic centimeter or less and weight of less than three grams make it ideally suited for robotic fiber less material processing applications.

The present invention is a radial laser diode pumped solid state laser that utilizes "inserts" between each radial diode "spoke" that serves to define micro flow channels for cooling both the laser rod as well as the diodes. In the preferred embodiment a vapor deposited conduction layer, that is built up in thickness using an electroplating method is used to carry current radially to the diodes. In another embodiment, fingers or brushes on the inserts contact the diodes and carries through the diode radially around the rod.

The laser has two end pieces; and a laser rod is inserted through a hole in each end piece. In the preferred embodiment the laser rod has a highly doped core and an undoped annylan region. The doped core may be Y6 and the host may be phosphate glass. The end pieces each have five (in the preferred embodiment) extending radially from the laser rod. Slots in the spokes allow laser diode bars as well as artificial (contaminate protecting) diodes to be put in the slots. The number of slots and spokes can be any number, but 3–11 are reasonable with 5 being the preferred embodiment. Inserts are placed between the diode "spokes" and when potted in place serve to define a sleeve for containing coolant, thus confining the coolant to a thin layer close the rod and diodes. The last insert is split into two halves with an insulating layer between each halve. When a dielectric material is inserted and bonded in place each half insert becomes an electrode with foil electrodes slid into pre-manufactured slots on the top (external) portion of each insert half. In another embodiment small fingers extending from the inserts contact the diodes and carry current circumferentially around the rod. The micro flow channels confine and compress the semi-stagnate boundary layer; and this increases heat transfer because the boundary layer is thinner. Additionally, because the coolant is in contact with the laser diodes directly, there is no detrimental bulk thermal resistance or contact resistance. The preferred embodiment has the advantage of being a very efficient reflector because the reflector is coated right on the rod. Also, current may be spread easily through the thick coating. The finger embodiment has the advantage of fast, simple assembly with no masking needed because there is no coating step.

Other aspects of this invention will appear from the following description and appended claims, reference being made to the accompanying drawings forming a part of this specification wherein like reference characters designate corresponding parts in the several views.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the pertinent art to make and use the invention.

FIG. 22 is a ganged laser array sharing end caps with multiple rods.

FIG. 23 is a ganged laser array having a single rod, and a plurality of pumps.

FIG. 25 is a perspective view of a centrally doped core of a laser rod and undoped annular region.

FIG. 26 is a laser with a passive photo refractive mirror switch for Q-switching or cavity dumping.

Before explaining the disclosed embodiment of the present invention in detail, it is to be understood that the invention is not limited in its application to the details of the particular arrangement shown, since the invention is capable of other embodiments. Also, the terminology used herein is for the purpose of description and not of limitation.

DETAILED DESCRIPTION OF DRAWINGS

Figure 1:
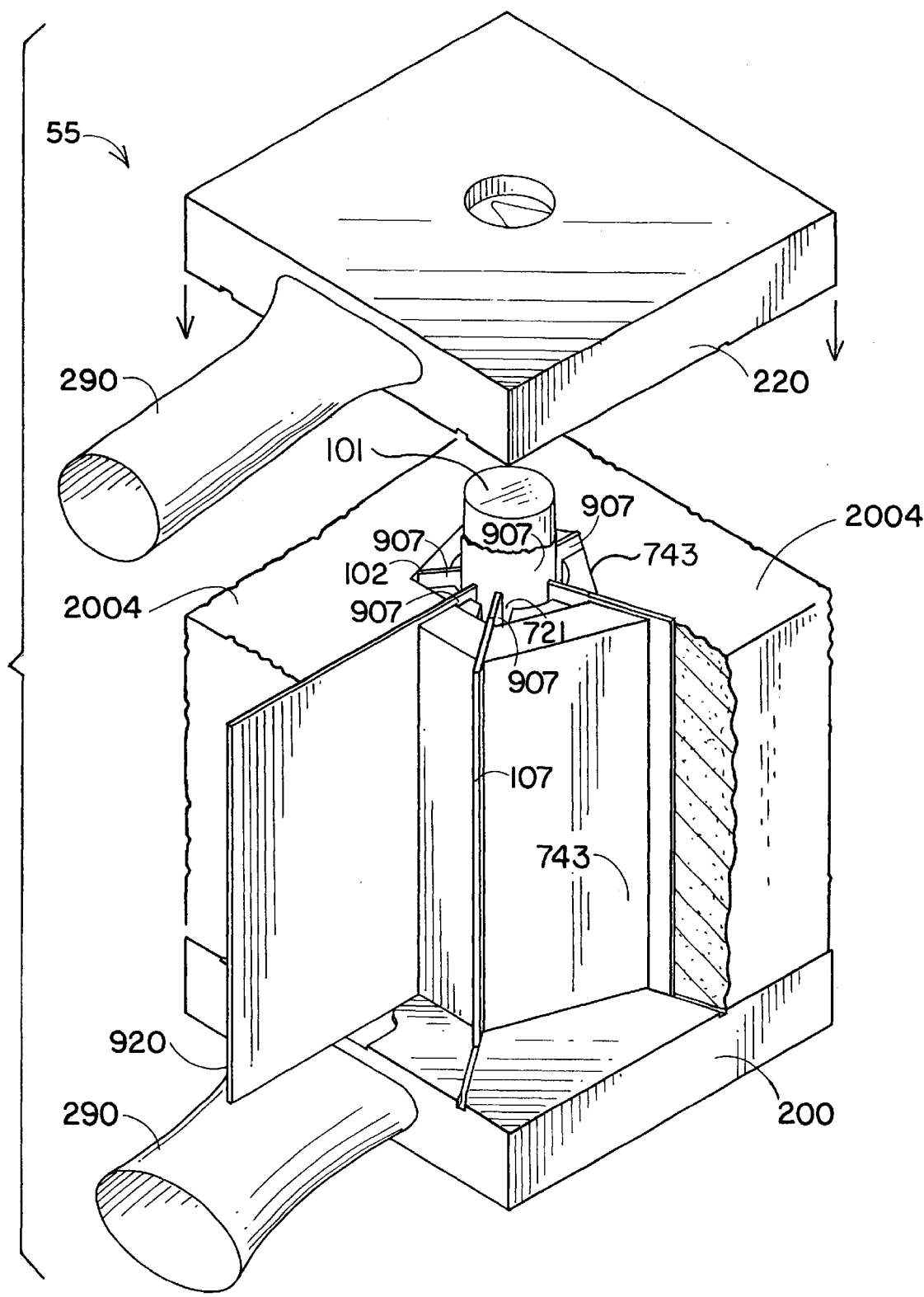
FIG. 1 is an exploded-view schematic diagram of the preferred diode laser package elements 55 according to the present invention.
Figure 2:
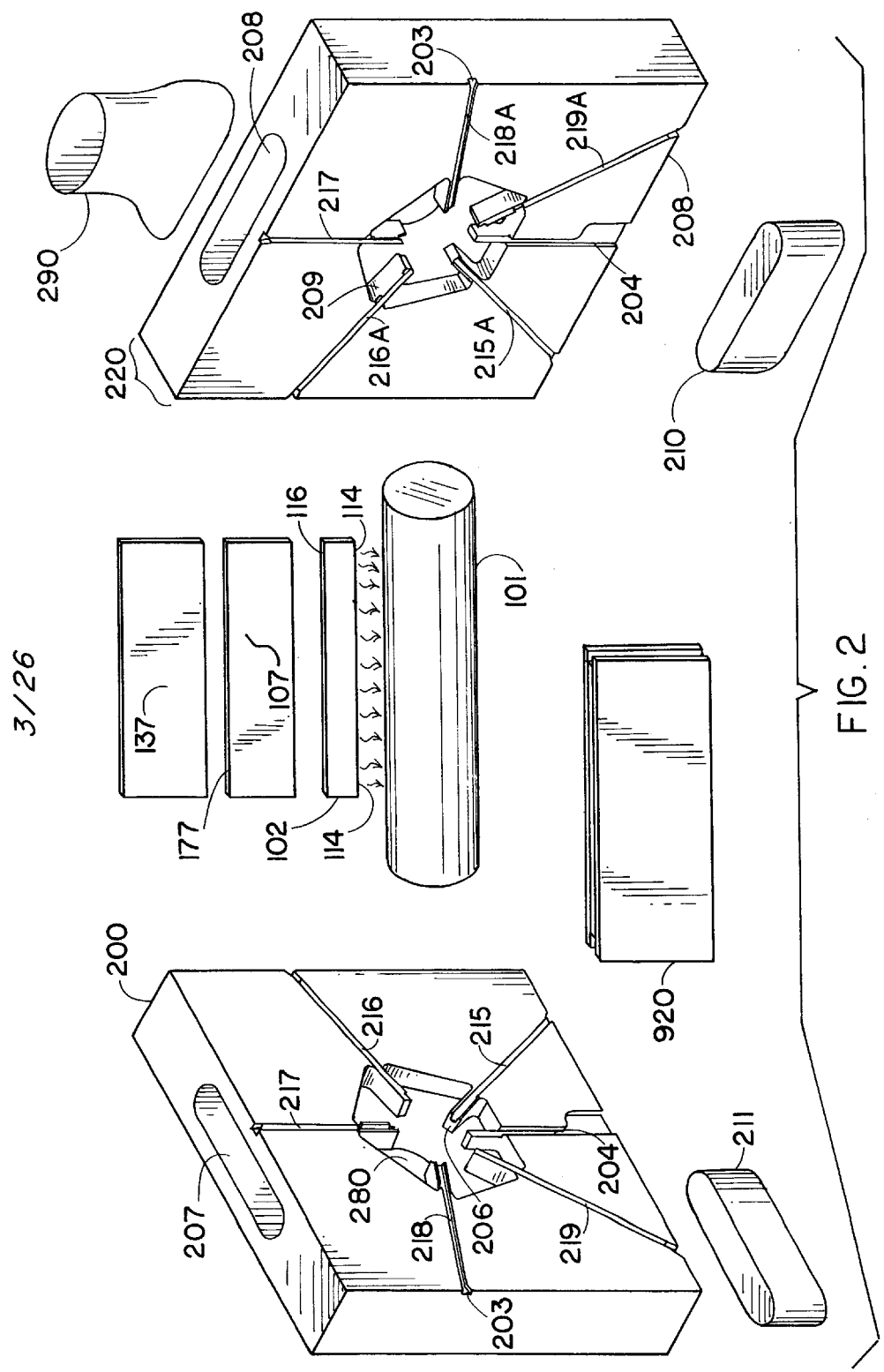
FIG. 2 is an exploded view of the laser aperture end cooling caps of FIG. 1 embodiment.
Figure 6:
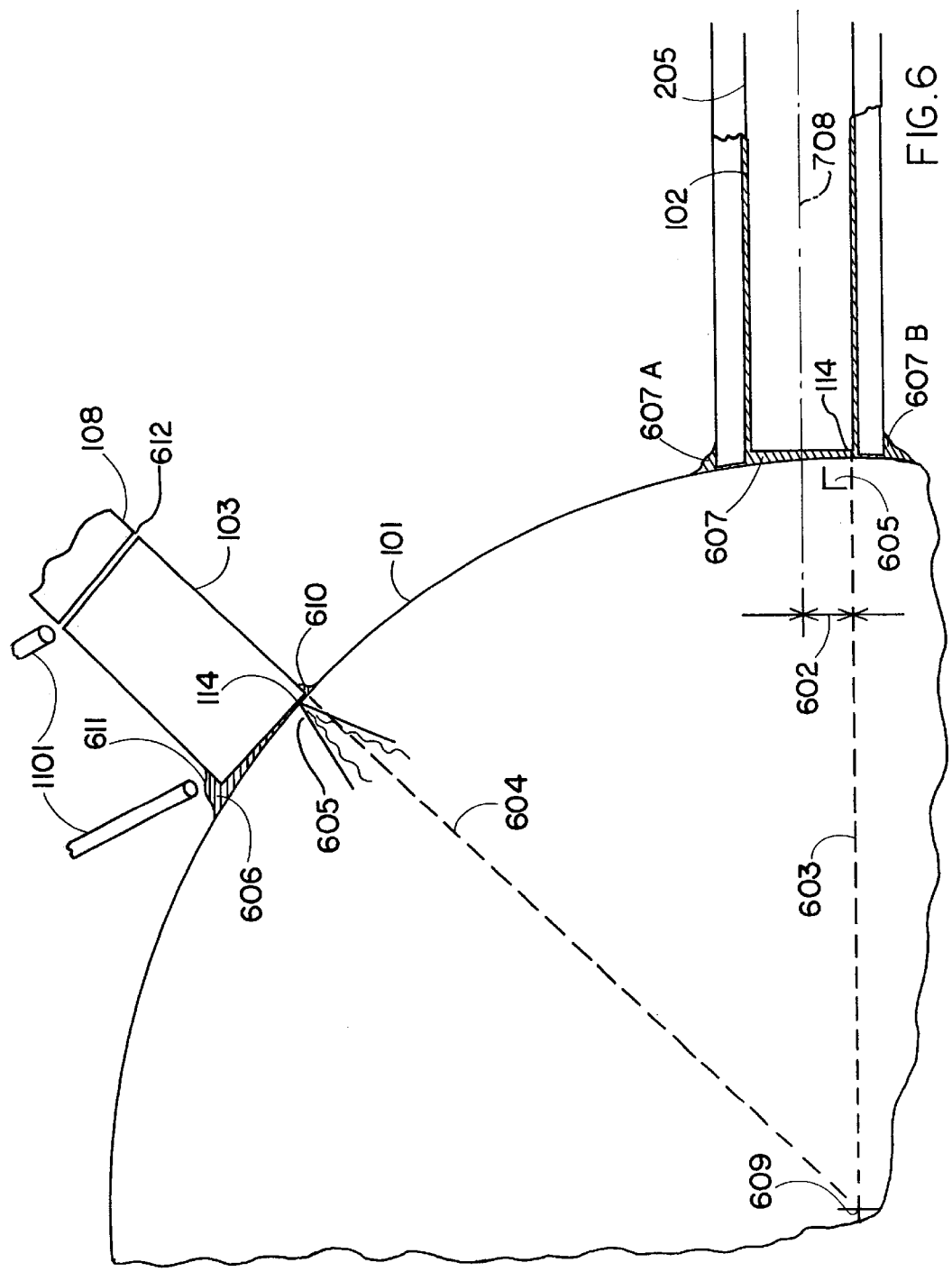
FIG. 6 is a detail view drawing of the laser rod and diode array interface of all embodiments of radial the present invention.
Figure 11:
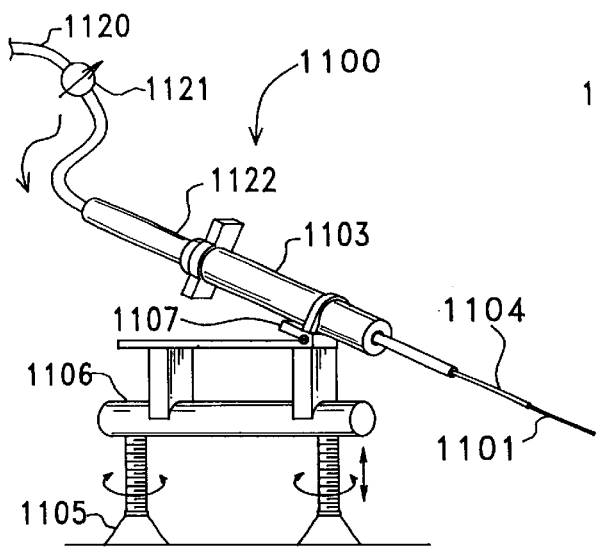
FIG. 11 is a detail view of an adhesive application fixture for the method.

FIG. 1 is an exploded view of the preferred embodiment 55. Using insertion fixtures 1400 (FIG. 14), 1500 (FIG. 15) and 1800 (FIG. 18) diode bar(s) 102–106, bars are pushed until contact is made with laser rod 101. Likewise electrode sandwich assembly 920 is inserted to contact the rod 101. FIG. 2 teaches the assembly operations installing coolant caps 200 and 220, laser rod 101, diode bars 102–106, diode spacers 107–111 and temporary masking aids 137 and 177 (removed). FIGS. 6 and 11 teach the important adhesive and masking application operations. Next conductive layers are applied to sub assembly 1300 (FIG. 13) with vacuum deposition operation(s) as taught in FIGS. 9 and 13. FIG. 8 and 8C detail the preferred and alternate diode bar ohmic connections. Optional additional conductive layers may be applied to sub assembly 1600 (FIG. 16) with electroplating operation(s) as taught in FIG. 16. The metal deposition makes the laser rod, caps, spacers and pump bar(s) a monolithic structure. Spacers 743 (FIG. 7C) are installed and bonded in place, forming micro-channels 721. In the preferred embodiment coolant with nano particles circulates in a single loop simultaneously cooling, rod 101, conductive film 907 and diode bar(s) 102–106. UV cure potting compound 2004 is applied to form the final monolithic structure. Potting material 2004 is cutaway to reveal internal parts. The unique low weight, monolithic structure may be cooled with a pressurized loop. Coolant enters top port 207 from external pump and heat exchanger not shown. Coolant exits micro channel 208 after circulating around laser rod 101 and diode bar(s) 102–106. Laminated Teflon/stainless steel/polyurethane tube 290 are inserted and bonded into ports 208 and 207. The instant invention with novel fixtures allows ease of assembly, precise component alignment, minimal part count, high cooling efficiency, yielding a compact monolithic design and very high power densities. Unique manufacturing methods ensure high yields and excellent repeatability. The assembly fixtures may be easily motorized for robotic assembly methods further enhancing repeatability and reducing costs.

Figure 1A:
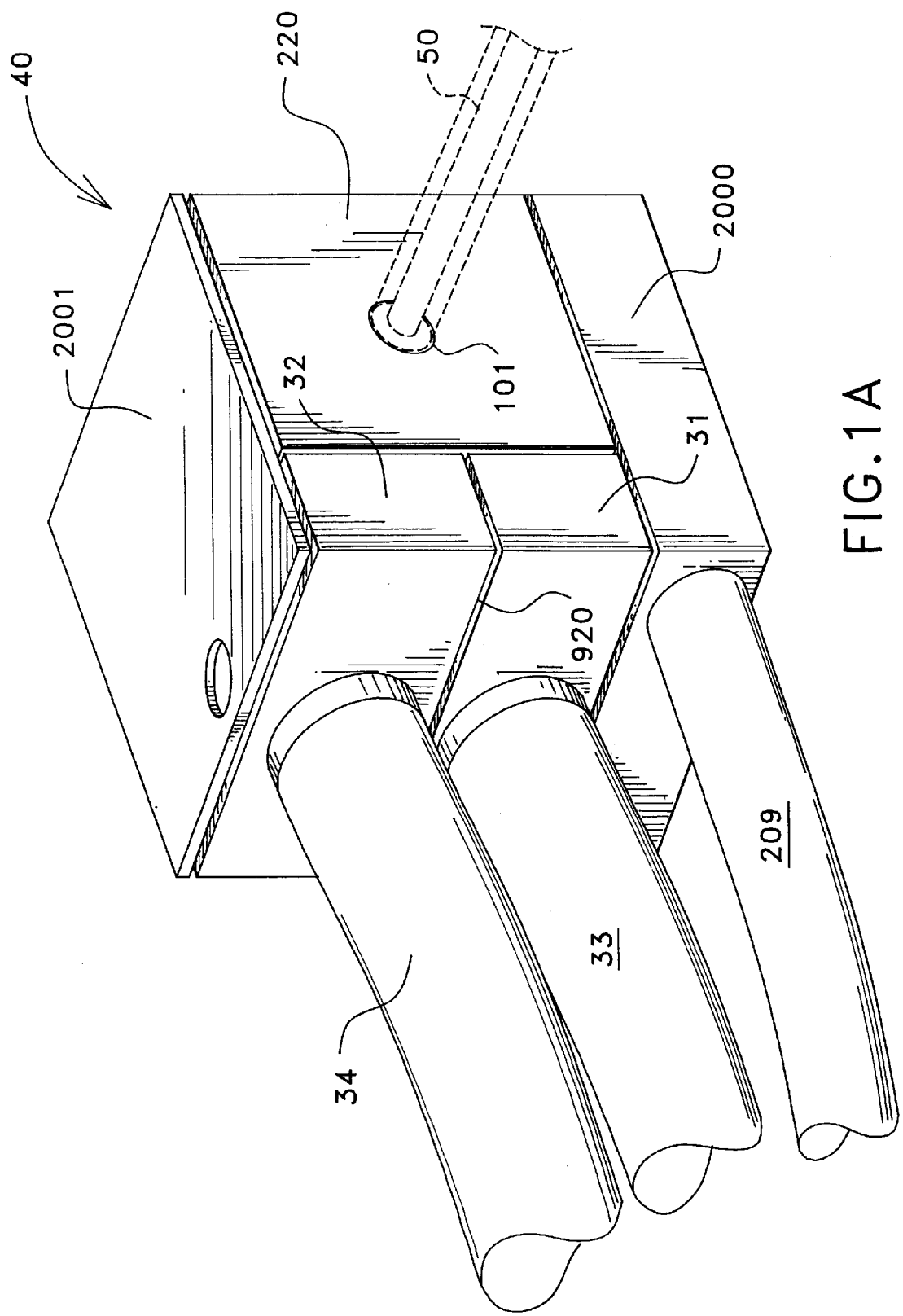
FIG. 1A is a perspective view of the preferred embodiment in action.
Figure 20:
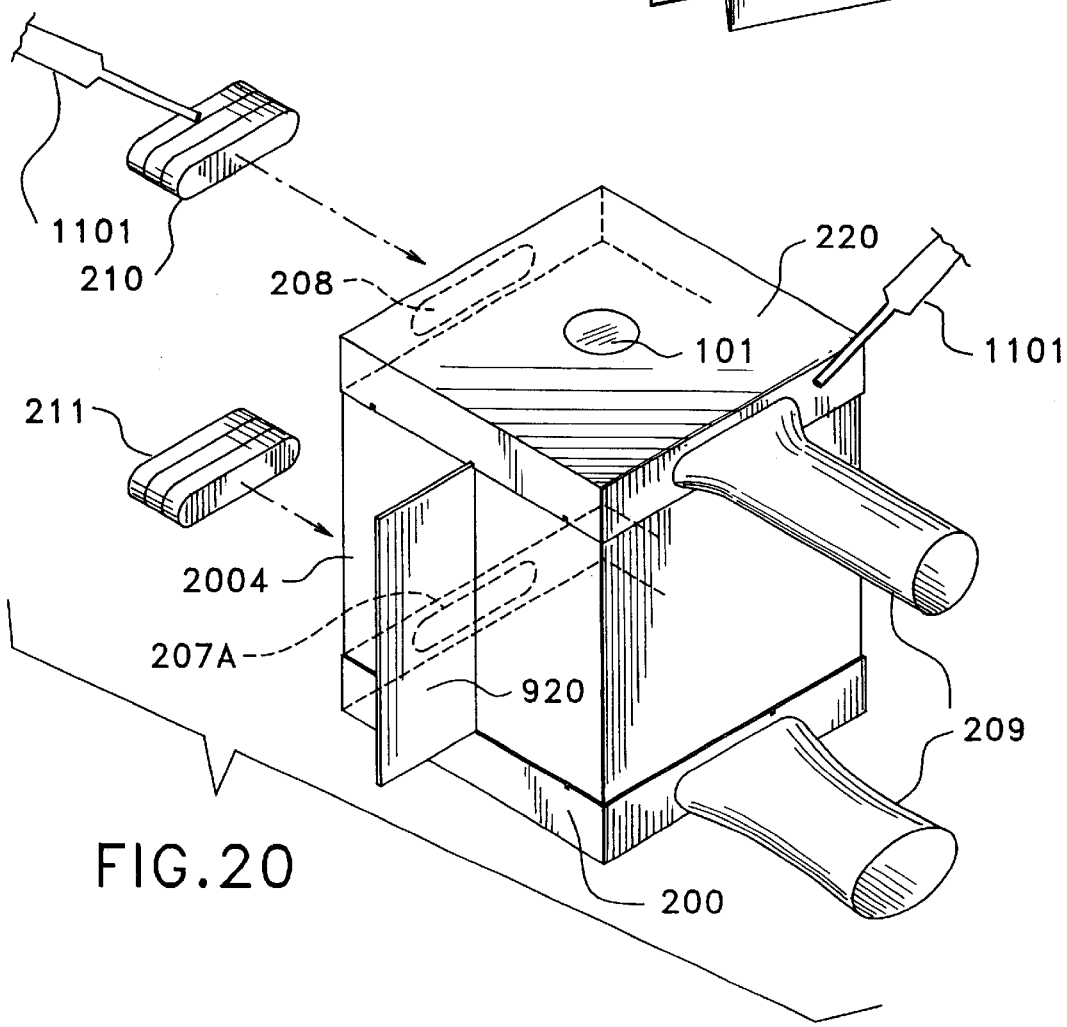
FIG. 20 is a detail view of the preferred heat exchanger cooling tubes.

FIG. 1A. Is a magnified perspective view of the preferred embodiment of the final laser assembly 40. Laser energy (beam) 50 exits laser rod 101. End body caps 2002 and 2001 captures laser rod 101 and electrodes 31 and 32. External power source (not shown) connects to leads 33 and 34. Termination electrodes 32 and 31 make ohmic contact to sandwich electrode 920. External cooling loop (not shown) connects to tubes 209. FIG. 20 is a similar configuration with coolant tube(s) 290 rotated 90 degrees, and electrodes removed.

Figure 9:
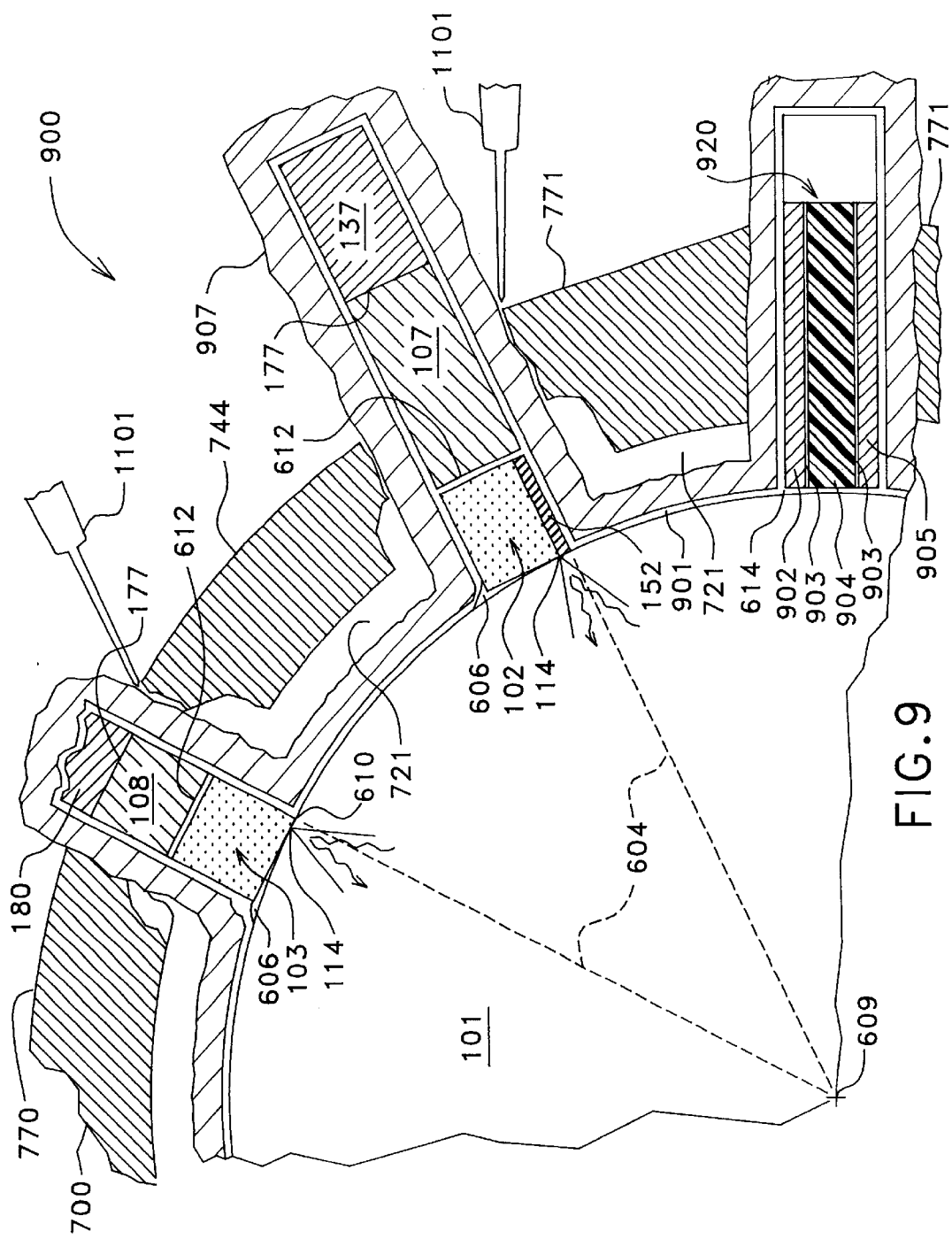
FIG. 9 is a cross sectional view of the method to create the coated (preferred) embodiment, it teaches the conductive film(s) application process of the preferred embodiment, showing vacuum/electroplated electrodes and micro-cooling channels for the preferred embodiment.
Figure 13:
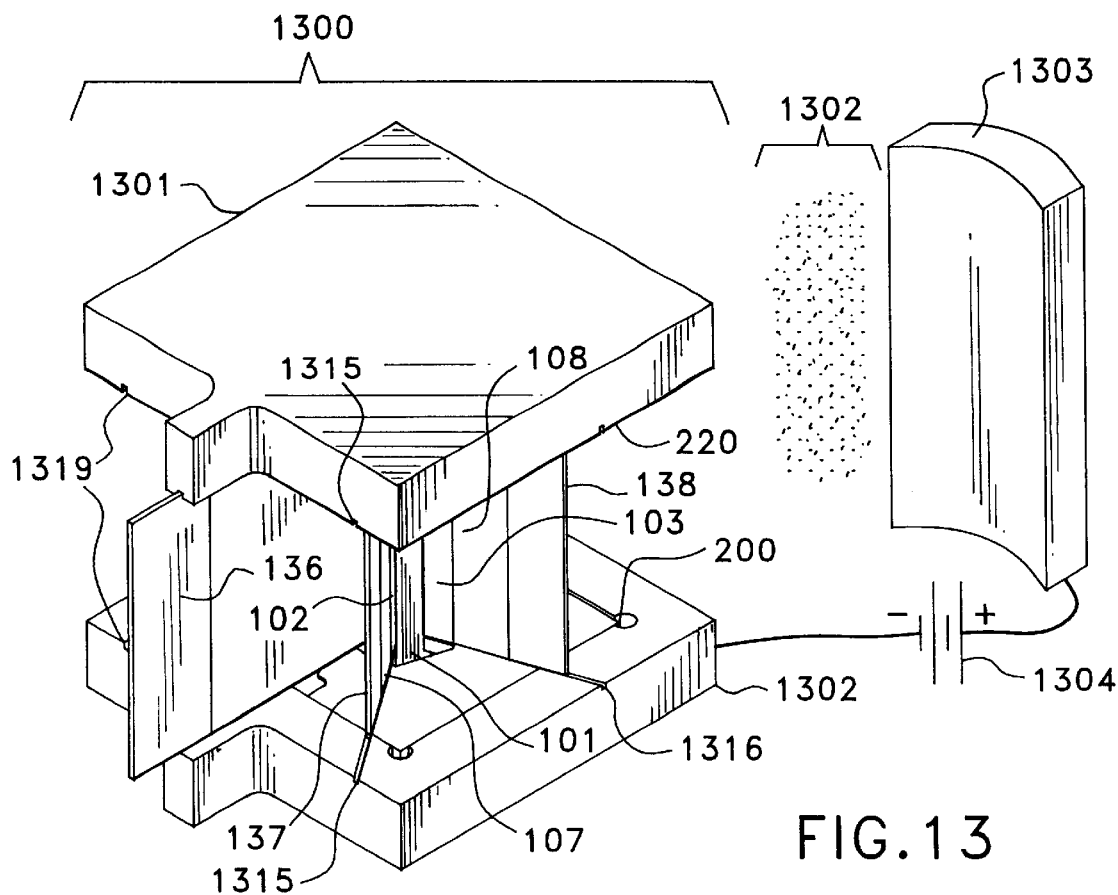
FIG. 13 is a detail view of the vacuum deposition fixture/process.

FIG. 2 is an exploded view of the preferred embodiment during initial assembly. Taper(s) 203 are assembly aides to gently guide and align the diode bar(s) 102 into groove 215. Tapered or beveled opening 203 is flared to accept the fragile laser diode bar 102. Diode bar 102 is inserted such that the offset emitting edge 114 contacts the rod 101. Groove(s) 215–219 width is approx. 0.0002" (5 microns) wider than the diode array. Groove 215 is slightly thicker than the diode spacer(s) 107–111. The diode spacers 107 are fabricated thicker than the diode bars to match the small "smile" common to long thin diode bars. Diode spacers 107–111 protect the rear facet 116 during later manufacturing steps, and provide electrical isolation. Groove 215 is extended in section 209 to the end 206. Section 209 wraps around diode bar(s) 102 insulating the "P" and "N" sides of the diode bars, during optional subsequent metal deposition operations (FIG. 13, and FIG. 16). Groove extensions 209 terminates with capturing laser rod 101 at 206. The center of groove 215 is offset such that the active emitting edge tangentially contacts the diode bar 102. This aspect is detailed in FIG. 6. The laser is assembled in an alignment cage 1400 (not shown, see FIG. 14). Coolant port caps 200 and 220 are inserted in to fixture 1400. Rod alignment gauge block 1500 (not shown, see FIG. 15) is inserted between caps 200 and 220. Laser rod 101 is slid into the opening 280 and into the bore of the block 1500. Protruding fingers 209 securely capture the rod 101. Small amounts of optical adhesive are applied with fixture 1100 (not shown, see FIG. 11) to the finger-rod interfaces. Using insertion fixture 1800 (not shown, see FIG. 18) electrode sandwich assembly 920 is inserted into slots 204 and mirror slots 204A. Electrode is pushed until contact is made with laser rod 101. Small amounts of optical adhesive as taught in FIG. 9 are applied with fixture 1100 grooves 204-A. Capillary action "wicks" adhesive under the electrode-rod interface. Additionally, multiple small drops may be applied or dragged across the electrode-rod interface. Using insertion fixture 1800 (not shown, see FIG. 18) diode bar 102–106 bar(s) are inserted into radially dispersed slots 215–219 and mirror slots 215A–219A. Diodes are pushed until contact is made with laser rod 101. For clarity, additional diodes have been removed. Next using insertion fixture 1800 (not shown, see FIG. 18), diode spacers 107–111 are inserted into radially dispersed slots 215–219 and mirror slots 215A–219A. Diode spacer(s) 107 are pushed until contact is made with facet of diode(s) bar 102–106. Small amounts of optical adhesive as taught in FIG. 6 are applied with fixture 1100 to the n-side of diode facet-insulator interface(s) 612 (FIG.6). Dielectric extension and adhesive function to protect the rear facet and provide electrical isolation. For clarity, additional spacers have been removed. Next using insertion fixture 1800, additional masking spacer(s) 137 are inserted into radially dispersed slots 215–219 and mirror slots 215A–219A. Masking spacer(s) 137 are pushed until contact is made with diode spacer(s) 107–111. Alternately, an ammoniatel latex cap 180 (FIG. 9) available from Chemtronix (Kenesaw, Ga.) may be applied to surface(s) 177 in place of the masking spacer(s) 137 as shown in FIG. 9 diodes and removed after the plating step FIG. 16. Other solder mask materials may be used, this is offered by way of example and not limitation. In the preferred embodiment caps 200 and 220 are fabricated from Celazole available from Boedeker (Shiner, Tex. USA) or 50/30 Glass filled Torlon™. This material is offered by way of example and not a limitation as other materials have substantially equivalent properties and will perform similarly with low thermal expansion. This material was selected for its dimensional stability. Caps 200 and 220 may be molded or machined. End caps perform a variety of functions such as coolant distribution, rod alignment, capturing spacers and precise alignment of the diode array to the rod. Coolant enters top port 207 from external pump and heat exchanger not shown. Coolant exits micro channel 208 after circulating around laser rod 101 and diode bar(s) 102–106. The laser will operate with one or more diode bar(s). The preferred embodiment employs five and is offered by way of example and not limitation. Bottom coolant ports 207A and 208A are plugged with blocks 210–211 and glued into place. This is offered by way of example and not limitation. The ports may be reversed or both may be used in applications requiring higher coolant flow rates. Laminated Teflon/stainless steel/polyurethane tube(s) 290 available (H V Technology 490 US HY 11, Trenton, Ga.) are inserted and glued into ports 208 and 207 after deposition steps FIG. 13 and FIG. 16. Other tubing materials may be used, this is offered by way of example and not limitation. In an alternate embodiment, coolant caps 2000–2001 (FIG. 20) are glued to coolant ports 207–208 and 207A–208A. Elimination of the coolant end caps in the preferred embodiment 2000–2001 further reduces the volume and weight of the invention with no loss in cooling performance. The instant invention allows ease of assembly, precise component alignment, minimal part count and high cooling efficiency, yielding a robust, extremely compact design with very high power densities. With unique manufacturing methods high yields and excellent repeatability are achieved. The assembly fixtures may be easily motorized for robotic assembly methods further enhancing repeatability and reducing costs.

Figure 3:
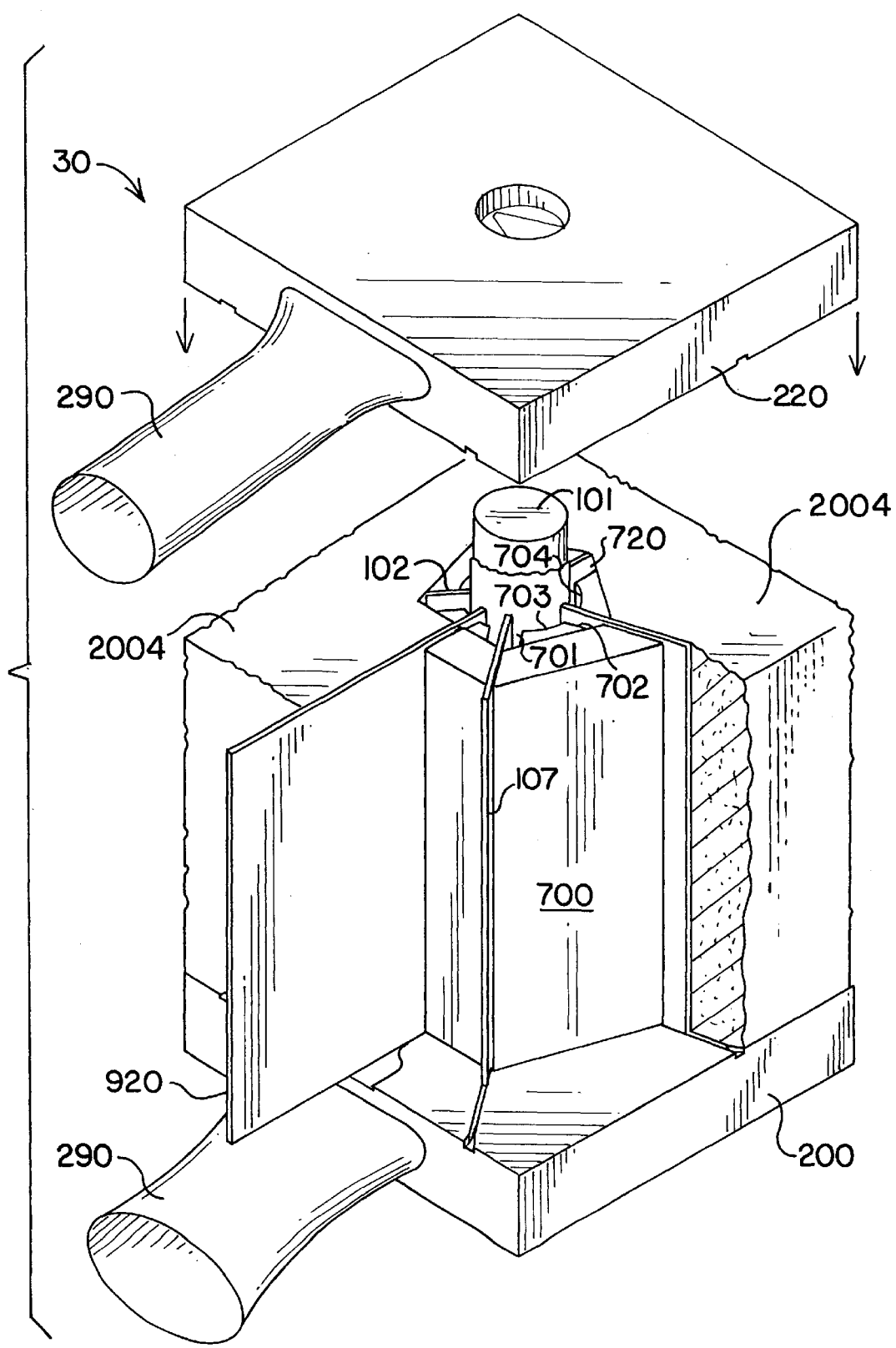
FIG. 3 is a 3D view of the alternate laser assembly, wherein the inserts have electrical contact fingers instead of a contact coating.

FIG. 3 is an exploded view of an alternate embodiment 30. Using insertion fixtures 1400 (FIG. 14), 1500 (FIG. 15) and 1800 (FIG. 18) diode bar(s) 102–106, bars are pushed until contact is made with laser rod 101. FIG. 2A teaches the assembly operations installing coolant caps 200 and 220, laser rod 101, diode bars 102–106, diode spacers 107–111 and temporary masking aids 137 and 177 (removed). FIG. 6 and 11 teach the important adhesive and masking application operations. Spacers 700 (FIGS. 7, 7A and 7B) are installed and bonded in place, forming micro-channels 704 and 720. Insert(s) 700 with polished surface 703 reflects pump energy onto center of rod 101. FIG. 8A and 8B details the finger diode bar ohmic connections. UV cure potting compound 2004 is applied to form the final monolithic structure. Potting material 2004 is cutaway to reveal internal parts. Coolant enters top port 207 from external pump and heat exchanger not shown. Coolant exits micro channel 208 after circulating around laser rod 101 and diode bar(s) 102–106. Laminated Teflon/stainless steel/polyurethane tube 290 are inserted and bonded into ports 208 and 207. The unique low weight, monolithic structure may be cooled with a pressurized loop. In the preferred embodiment coolant with nano particles circulates in a single loop simultaneously cooling rod 101, conductive "fingers" 701–702 and diode bar(s) 102–106. The instant invention with novel fixtures allows ease of assembly, precise component alignment, minimal part count and high cooling efficiency, yielding a compact monolithic design and very high power densities. Unique manufacturing methods ensure high yields and excellent repeatability. The assembly fixtures may be easily motorized for robotic assembly methods further enhancing repeatability and reducing costs.

Figure 4:
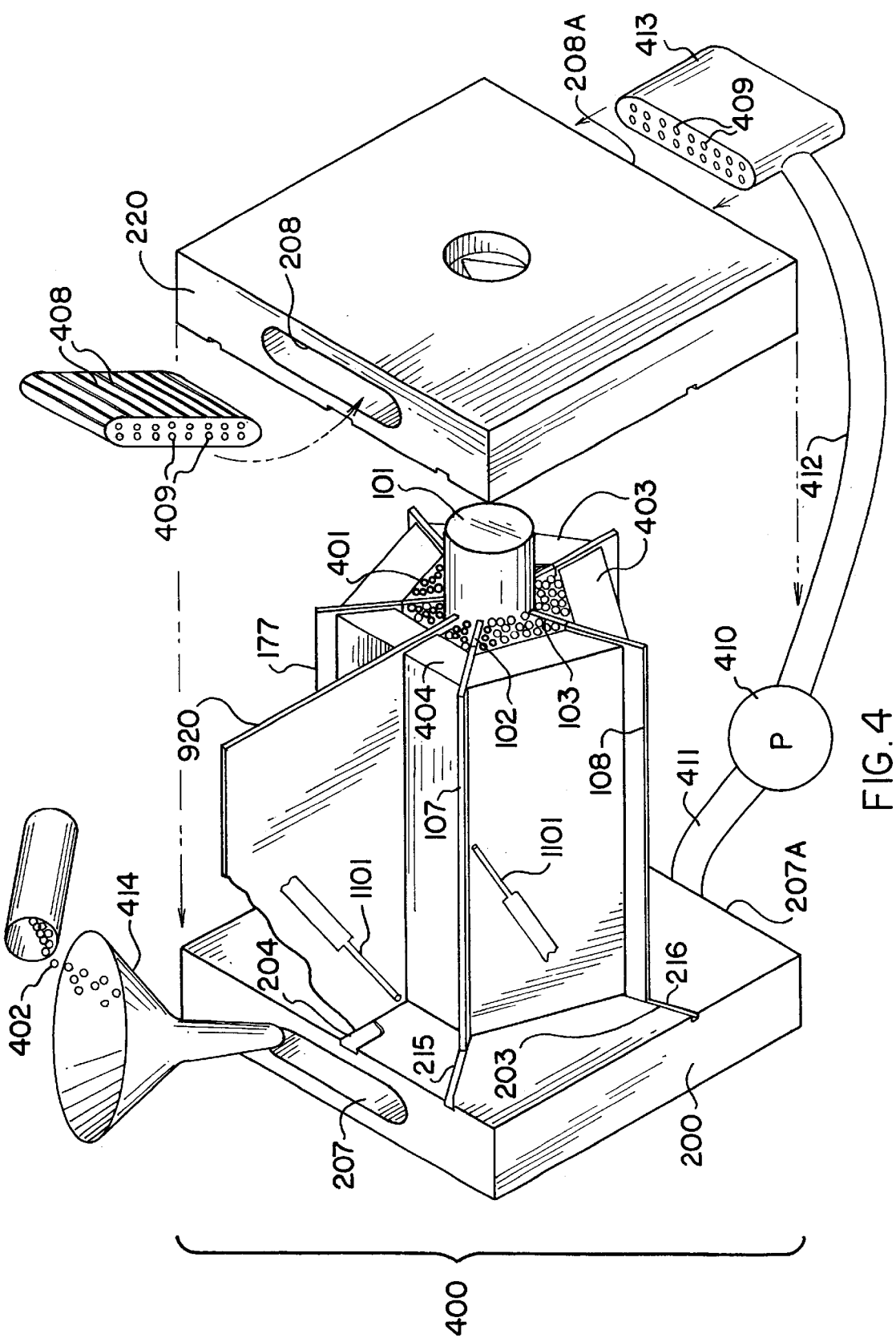
FIG. 4 is a schematic diagram of the laser package housing according to a third embodiment of the present invention; and is an exploded view schematic diagram of the alternate embodiment using spheres.

FIG. 4 is an exploded view of an alternate embodiment using microspheres during assembly. Taper(s) 203 are assembly aids too gently guide and align the diode bar(s) 102 into groove 215. The preferred embodiment employs five diodes and is offered by way of example and not limitation. Tapered or beveled opening 203 is flared to accept the fragile laser diode bar 102. Diode bar 102 is inserted such that the offset emitting edge 114 may contact the rod 101. Groove(s) 215–219 width is approx. 0.0002" (5 microns) wider than the diode bar. Groove 215 is approximately slightly thicker than the diode spacer(s) 107–111. The diode spacers 107 are fabricated to match the small "Smile" common to long diode bars. Diode spacers 107–111 protect the rear facet 116 during later manufacturing steps, and provide electrical isolation. Groove 215 is extended in section 209 to the end 206 (see FIG. 2). Section 209 wraps around diode bar(s) 102 insulating the "P" and "N" sides of the diode array, during optional subsequent metal deposition operations. Groove extensions 209 terminates with capturing laser rod 101 at 206. The center of groove 215 is offset such that the active emitting edge may tangentially contact the laser rod 101. This aspect is detailed in FIG. 6. The laser is assembled in an alignment cage 1400 (not shown, see FIG. 14). Coolant port caps 200 and 220 are inserted into fixture 1400. Rod Alignment gauge block 1500 (not shown, see FIG. 15) is inserted between caps 200 and 220. Laser rod 101 is slid into the opening 280 and into the bore of the block 1500. Protruding fingers 209 securely capture the rod 101. Small amounts of optical adhesive are applied with fixture 1100 (not shown, see FIG. 11) to the finger-rod interfaces. Using insertion fixture 1800 (not shown, see FIG. 18) electrode sandwich assembly 920 is inserted into slots 204 and mirror slots 204A. Electrode is pushed until contact is made with laser rod 101. Small amounts of optical adhesive as taught in FIG. 9 are applied with fixture 1100 grooves 204-A, capillary action "wicks" adhesive under the electrode-rod interface. Using insertion fixture 1800 (not shown, see FIG. 18) diode bar 102–106 bar(s) are inserted into radially dispersed slots 215–219 and mirror slots 215A–219A. Diodes can be pushed until contact is made with laser rod 101. Next using insertion fixture 1800 (not shown, see FIG. 18) diode spacers 107–111 are inserted into radially dispersed slots 215–219 and mirror slots 215A–219A. Diode spacer(s) 107 can be pushed until contact is made with facet of diode bar 102–106. Small amounts of optical adhesive as taught in FIG. 6 can be applied with fixture 1100 to diode facet-insulator interface(s) 612 (FIG.6). Dielectric spacers and adhesive function to protect the rear facet and provide electrical isolation. Next using insertion fixture 1800 additional masking spacer(s) 137 are inserted into radially dispersed slots 215–219 and mirror slots 215A–219A. Masking spacer(s) 137 are pushed until contact is made with diode spacers 107–111. Alternately, an ammoniatel latex cap 180 (FIG. 9) available from Chemtronix (Kenesaw, Ga.) may be applied to surface(s) 177 in place of the masking spacer(s) 137 as shown in FIG. 9 diodes and removed after the electroless plating step. Other solder mask materials may be used, this is offered by way of example and not limitation. For clarity additional masking spacers 137 have been removed. In the preferred embodiment caps 200 and 220 are fabricated from Celazole or glass filled Torlon 5030 available from Baodeker, Shiner, Tex. This material is offered by way of example and not a limitation as other materials have substantially equivalent properties and will perform similarly. This material was selected for its dimensional stability and low thermal expansion. Caps 200 and 220 may be molded or machined. End caps 1301–1302 (not shown) are slipped over the Caps 200 and 220. Titanium adhesion 902, gold reflective 903 and copper conduction 907 layers are applied to assembly 400A as taught in FIG. 13. Inserts 403 and 404 are pressed and glued into place using 1101 (FIG. 11). The assembly is now ready to receive spheres 402. The assembly comprising the insert 403 and the spheres 402 are called a ring segment. Special Temporary plugs 413 with 0.005" grooves 408 and holes 409. Grooves 408 are smaller than the 0.010" spheres 402 thus allowing the plating solution to circulate without the spheres falling out. Plugs 413 are inserted into 207A–208A. Solid metallic spheres or coated spheres 402 of preferred 0.010" diameter are poured into ports 207 and or 208. This is offered by way of example and not limitation. To insure no voids are formed the assembly 400 may be vibrated during filling. After filling, additional plugs 413 are inserted into 207 and 208. The plugs insure the spheres do not fall out before the electroless process is complete. Electroless copper is circulated by pump 410 through hoses 411 and 412 and into ports into 207A–208A. Depositing additional 0.001–0.005" of copper on the rod 101, diode bar 102–106, diode spacers 107–111 and metallic spheres 401.

When the final desired thickness is achieved, temporary plugs 413 are removed and replaced with the final coolant connections. The preferred laminated Teflon/stainless steel/polyurethane tube(s) 290 (not shown) available (H V Technology 490 US Highway 11, Trenton, Ga.) are inserted and glued into ports 208 and 207. Other tubing materials may be used, this is offered by way of example and not limitation. In an alternate embodiment coolant caps 2000–2001 (FIG. 20) are glued to coolant ports 207–208 and 207A–208A. Elimination of the coolant end caps in the preferred embodiment 2000–2001 further reduces the volume and weight of the invention with no loss in cooling performance. Coolant enters top port 207 from external pump and heat exchanger (not shown). Coolant exits micro channel 208 after circulating around laser rod 101, micro-sphere matrix 401 and diode bar 102–106. The instant invention allows ease of assembly, precise component alignment, minimal part count and high cooling efficiency, yielding a robust, extremely compact design with very high power densities. With unique manufacturing methods high yields and excellent repeatability are achieved. The fixtures may be easily motorized for robotic assembly methods further enhancing repeatability and reducing costs.

Figure 5:
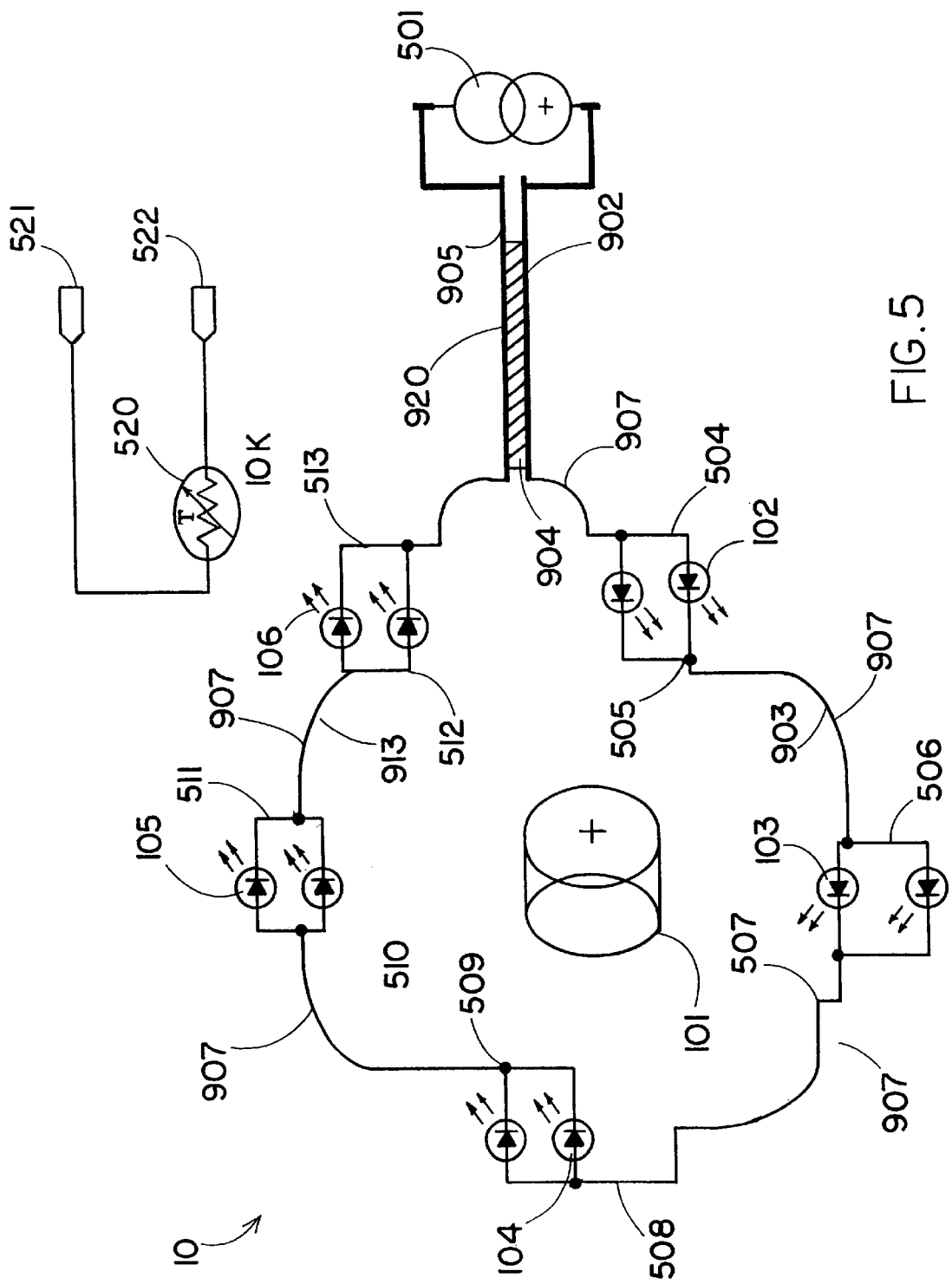
FIG. 5 is an electrical schematic diagram of the preferred embodiment of the present invention.

FIG. 5 is an electrical schematic of the preferred embodiment 10. External power source 501 connects to positive electrode 902 and return electrode 905. Electrode sandwich assembly 920 (FIG. 9) is glued to the laser rod 101 as taught in FIG. 9. Conductive layer 907 is a composite of adhesion, reflective and thick conduction layers. Conductive films applied by vacuum (FIG. 13) and optional electroplate process (FIG. 16). In the preferred embodiment application of titanium adhesion 902, gold reflective 903 and copper conduction 907 layers are taught in FIG. 9. In this way the composite conductive film serves three purposes. One, to act as a reflector to reflection focus pump energy to the center of the laser rod. Two, to act as a heat conduction to the micro-channel. Three, to act as a low resistance connection to diode bars and external power. Materials are offered by way of example and not limitation. Electrode 902 connects to film conductor 907 then to anode 504 of diode of first diode bar 102. Diode bar 102–106 may have 2–50 emitters per bar. In the preferred embodiment aluminum free diode bars manufactured by Coherent-Tutcore (Tampere, Finland) are used. This is offered by way of example not as limitation. Film 907 connects cathode 505 of diode bar 102 to anode 506 of diode bar 103. Film 907 connects cathode 506 of diode 103 to anode 508 of diode bar 104. Film 907 connects cathode 509 of diode 104 to anode 510 of diode bar 105. Film 907 connects cathode 511 of diode 105 to anode 512 of diode bar 106. Film 907 connects anode 513 of diode 106 to return electrode 905, thus forming and completing the series circuit. Optional reverse polarity, electrostatic discharge (ESD) and safety circuitry may be connected to terminals' power source 501. The laser assembly may be driven in pulsed or CW-mode. The very short circuit path length and low impedance nature of this package design allows the diode power to be switched at very high frequencies. Additionally the low impedance path allows the conduction of hundreds of amperes with minimal losses. To further reduce impedance, conductive electrode inserts 700, 750 and 755 as taught in FIG. 5A may be installed thus forming a parallel conduction path between diodes and electrodes. Another benefit of this alternate embodiment is the more uniform current distribution to the diode contacts. Wide foil electrode 920 provides a low impedance strip line for direct connection to external high-speed drivers. Dielectric insulator 904 with adhesive on both sides Paralex™ (P/N LF7021 Dupont, Wilmington, Del. USA) joins 0.002" thick copper foils 902 and 905. This is offered by way of example and not limitation. Other materials may be selected for high frequency loss or other dielectric properties required by the application. High performance CW/Pulsed laser drivers offered by Directed Energy Inc. (2401 Research Blvd., Suite 108, Fort Collins, Colo. 80526) may be used. Well known to the art is the diode wavelength dependence on temperature. This is commonly (+/−) 0.2 nanometers/C for diodes with a center wavelength of 808 nanometers. Laser rod 101 materials have various wavelength absorption bands. The width of the absorption band is material specific, therefore temperature control requirements are application specific. The diode temperature may be monitored via thermistor sensor 520. Terminals 521 and 522 connect to external signal processing circuitry for alarms or temperature control. The novel composite film provides a robust low impedance electrical connection. The novel integral reflector enhances beam quality and output power due to the fact that the pump power is so close to the rod. By making the components integral, small and light weight is achieved which is ideal for high G-environments. In both military and material processing, scientific, space and industrial applications weight is crucial. Efficient micro-channel cooling both with or without nano particles leads to high power capabilities, long life time, and efficient operation. Applications requiring ultra-short, high power pulses such as range finding, will benefit from the instant invention, due to it's short cavity length and resultant short photon round-trip time.

Figure 5A:
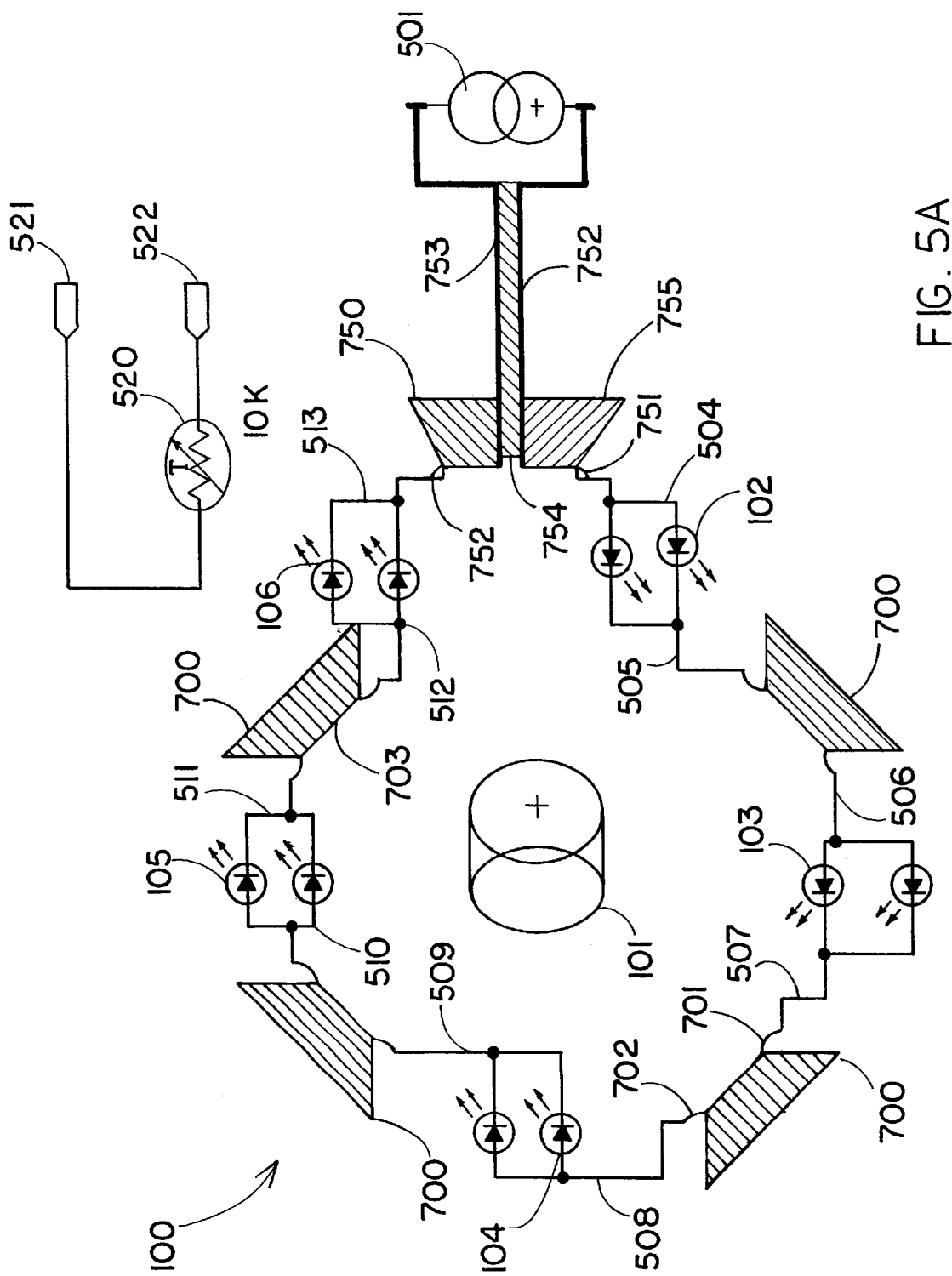
FIG. 5A is an electrical schematic diagram of the "fingers" alternative embodiment of the present invention.

FIG. 5A is an electrical schematic of the cube laser 100. External power source 501 connects to positive electrode 752 and return electrode 753. Metallic electrode 752 connects to lower ½ of split insert assembly 755. Electrode fingers 751 contact the anode 504 of diode first diode bar 102. Diode bar 102–106 may have 2–50 emitters per bar. In the preferred embodiment aluminum-free diode arrays manufactured by Coherent-Tutcore (Tampere, Finland) are used. This is offered by way of example not as a limitation. Cathode 505 of diode bar 102 contacts insert 700 through a series of wiping contacts 701. Body insert 700 continues the circuit. Electrode fingers 702 contact anode 506 of diode array 103. Cathode 507 of diode 103 contacts insert 700 through a series of wiping contacts 701. Body of insert 700 continues the circuit. Electrode fingers contact anode 508 of diode array 104. Cathode 509 of diode 104 contacts insert 700 through a series of wiping contacts. Electrode fingers contact anode 510 of diode array 105. Cathode 511 of diode 105 contacts insert 700 through a series of wiping contacts. Body of insert 700 continues the circuit. A reflective coating such as gold on the inside faces 703 toward laser rod 101 is applied, also forming part of the current path. Gold is offered by way of example and not limitation. Other highly reflective materials with excellent thermal and electrical conductivity such as silver or copper may be considered. Electrode fingers contact anode 512 of diode array 106. Electrode fingers 752 contact cathode 513 of diode array 106. Foil electrode 753 connects to upper ½ of split insert assembly 750, thus forming and completing the series circuit. Optional reverse polarity, electro static discharge (ESD) and safety circuitry may be connected to terminals 753 and 752. The laser assembly may be driven in pulsed or CW-mode. The very short circuit path length and low impedance nature of this package design allows the diode power to be switched at very high frequencies. Additionally the low impedance path allows the conduction of hundreds of amperes to be conducted with minimal losses. Wide foil electrodes provide a low impedance strip line for direct connection to external high-speed drivers. Dielectric insulator with adhesive on both sides 754 Paralex™ (P/N LF7021 Dupont, Wilmington, Del. USA) joins the insert halves 755 and 750. This is offered by way of example and not limitation. Other materials may be selected for high frequency loss or other dielectric properties required by the application. High performance CW/Pulsed laser drivers offered by Directed Energy Inc. (2401 Research Blvd., Suite 108, Fort Collins, Colo. 80526) may be used. Well known to the art is the diode wavelength dependence on temperature. This is commonly (+/−) 0.2 nanometers/C for diodes with a center wavelength of 808 nanometers. Laser rod 101 materials have various wavelength absorption bands. The width of the absorption band is material specific, therefore temperature control requirements are application specific. The diode temperature may be monitored via thermistor sensor 520. Terminals 521 and 522 connect to external signal processing circuitry for alarms or temperature control.

FIG. 6 is a detail of a magnified detail of the diode-laser rod interface. For clarity additional diode arrays 104–106 have been omitted. Edge emitting diode bar 102 and 103 are in the preferred embodiment symmetrically radially dispersed around laser rod 101. Five aluminum free active area diode arrays 750–1050 nm made by Coherent-Tutcore (Tampere, Finland) used in the preferred embodiment are offered by way of example and not limitation. Center-line 708 of groove(s) 215 (FIG. 2) is offset by ½ width of the groove 702. The offset 702 insures that the emitting edge 114 of diode bar 102–106 contacts the surface of rod 101. It places the emitting aperture center-line through the geometric center 609 of rod 101. It minimizes absorption and impedance (index of refection) losses as well as creating a more centrally (in reference to rod center) confined pump distribution. To further minimize reflections and insure maximum power delivered to the gain medium, a small amount of OP30 or OP40 (DYMAX, 51 Greenwoods Rd, Torrington, Conn.) optical adhesive is applied along intersection 611 opposite active edge 114. The low viscosity optical adhesive wicks into the small voids 606 and 607 along the length of the diode bar 102–106. The capillary action forms a very small fillet 610 on the side opposite the applicator 1101. A special fixture FIG. 11 with a Polyimide-(Kapton) (H V Technology 490 US HY 11, Trenton, Ga.) ultra fine hollow needle 1101 delivers the adhesive to 611. The optical adhesive forms small fillets at 610 and 611 forming a contamination barrier for subsequent metal deposition operations. One unique aspect of this instant invention is the elimination of expensive and complex lenses and/or optical fiber(s) to couple the diode pump energy to the laser medium. The small offset 602 minimizes the gap between the active edge and rod. Placing the diode array emitting apertures at the laser rod surface couples maximum diode energy into the central region of the rod with minimal divergence. It concentrates the pump energy in the center ⅓ of the rod, further minimizing higher order modes by reducing beam diameter and improving $M^2$.

Figure 7:
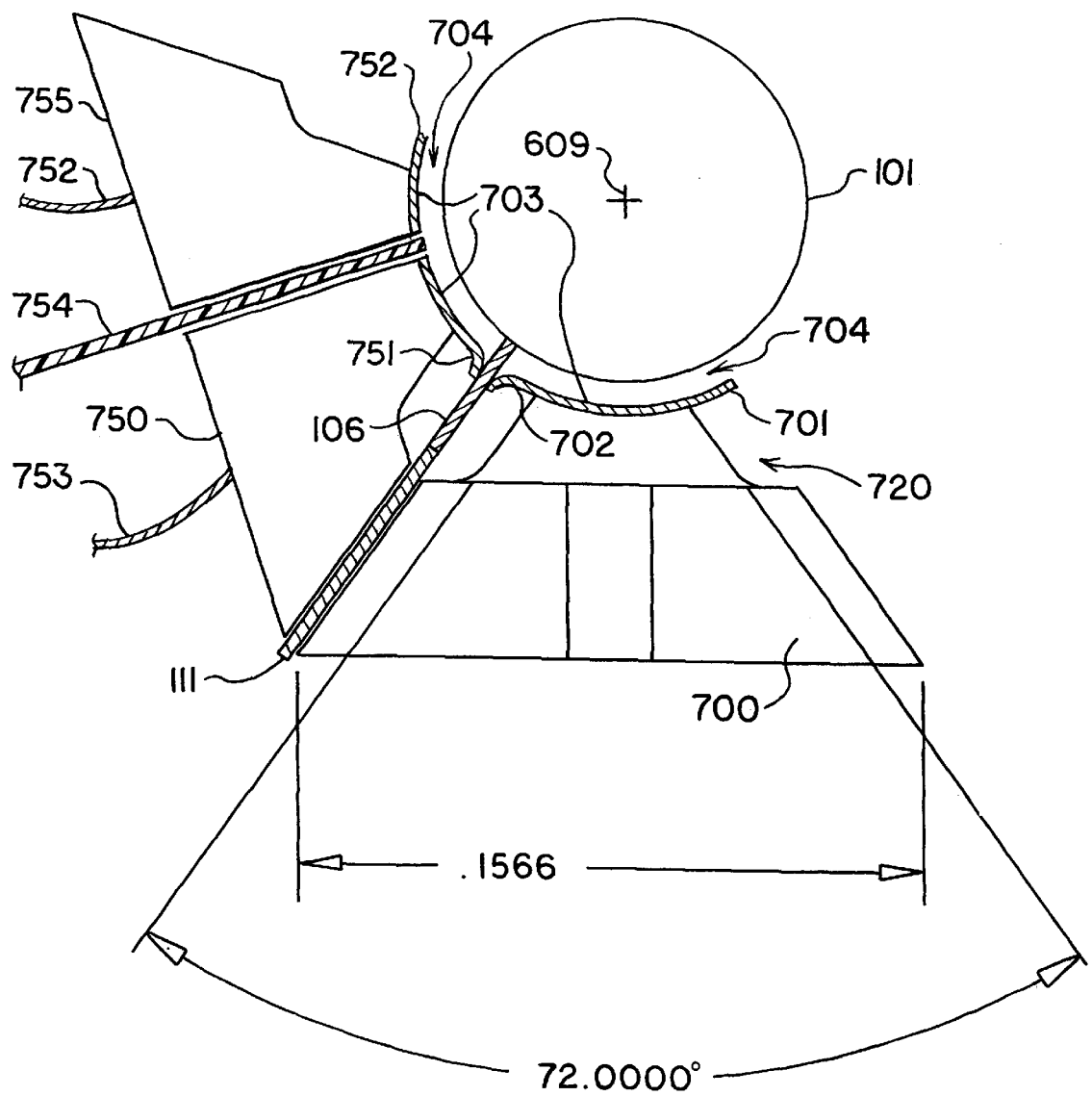
FIG. 7 is a cross sectional detailed radial end view of the electrode inserts and micro-cooling channels for the "fingers" alternate embodiment.
Figure 8:
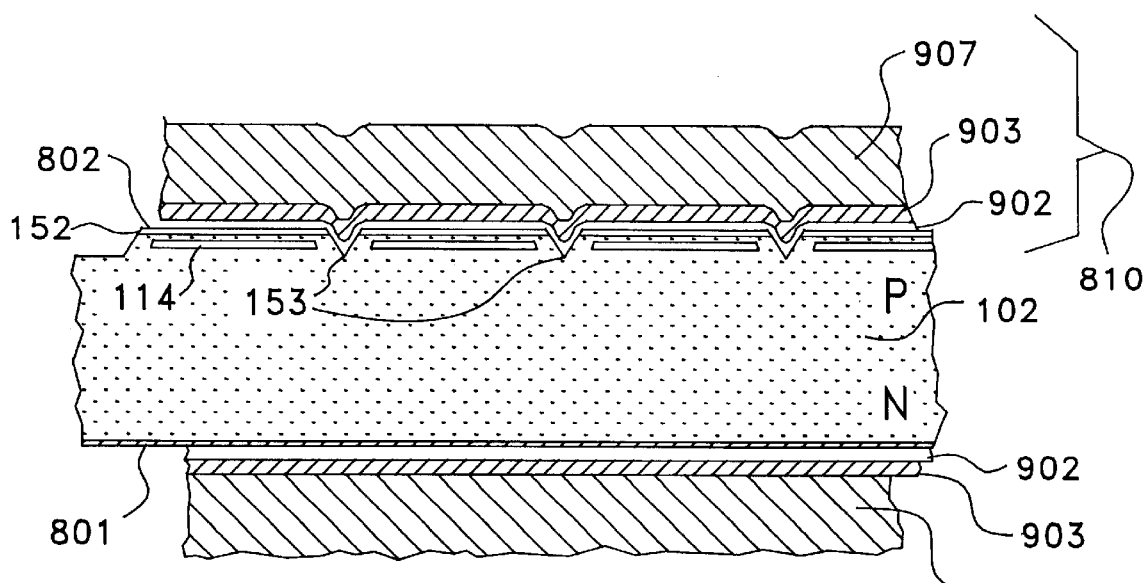
FIG. 8 is a magnified cutaway detail of the diode contacts showing the ohmic connections.
Figure 8A:
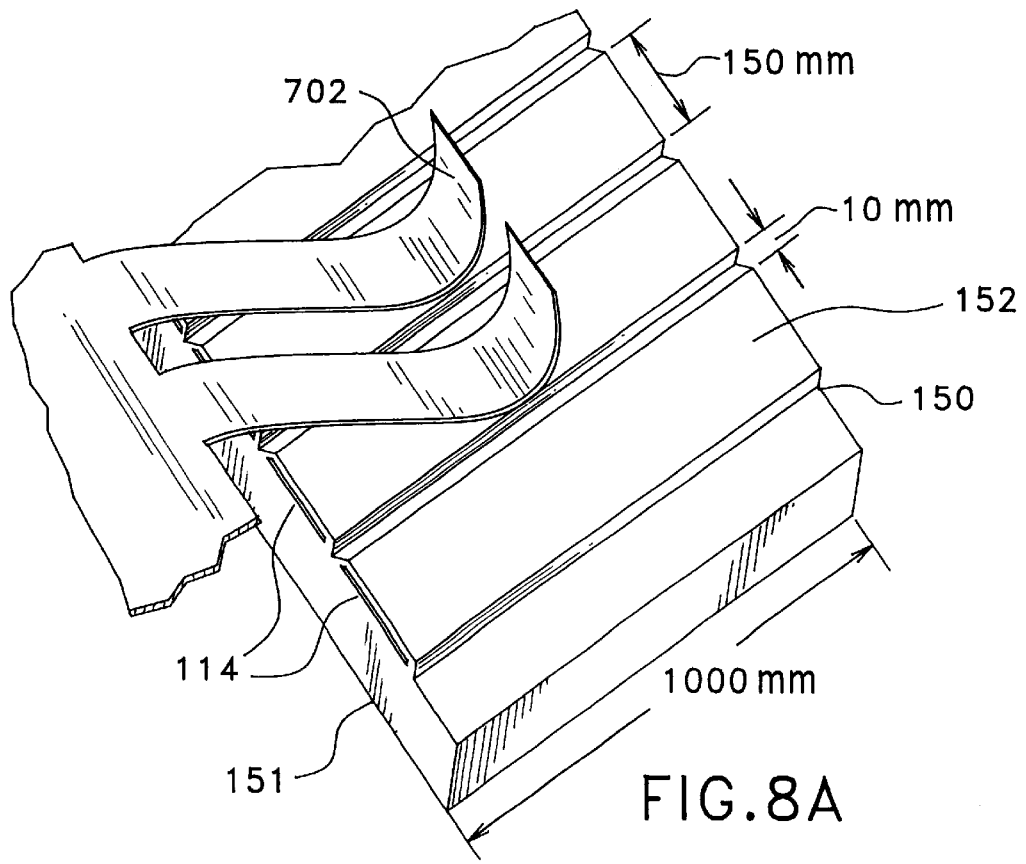
FIG. 8A is a magnified cutaway view of the "finger" contact.
Figure 8B:
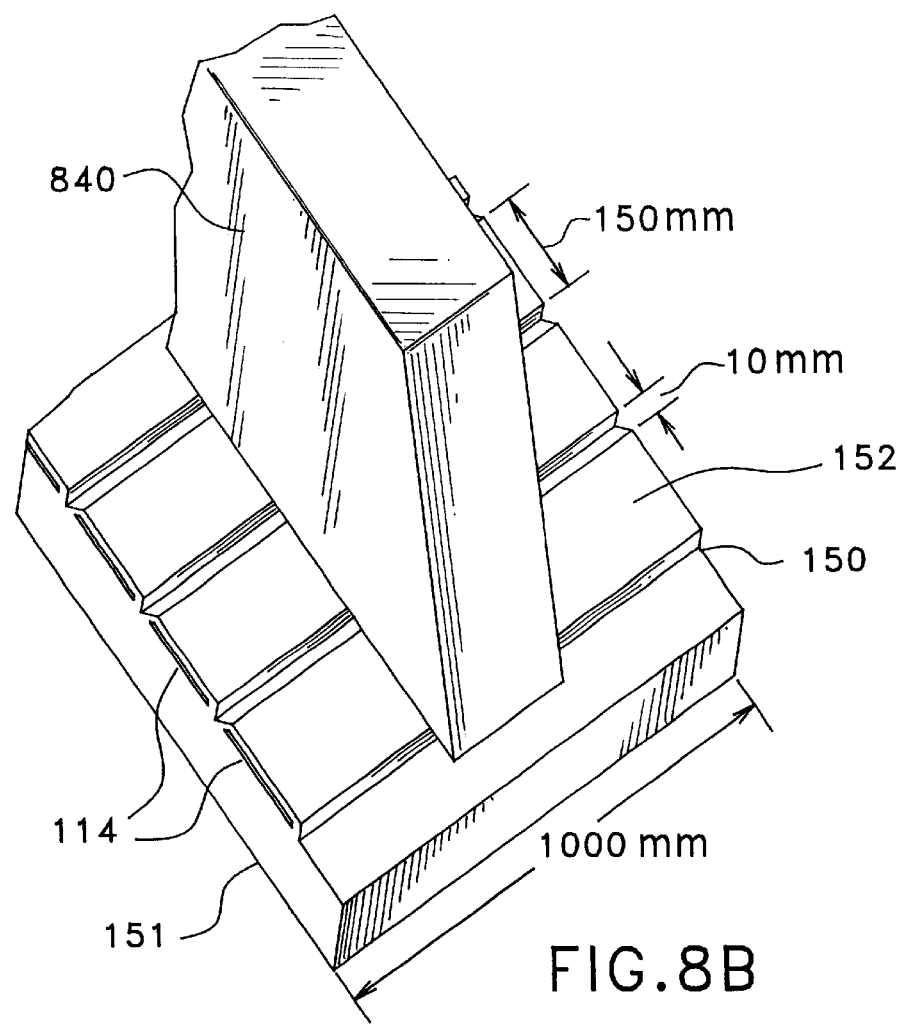
FIG. 8B is a magnified cutaway view of the "finger" embodiment having a single solid finger as opposed to multiple fingers.

FIG. 7 is a detailed end view of the preferred inserts 700, 750 and 755. Insert(s) form a conductive path between "P" and "N" contacts of adjacent diode arrays 102–106. For clarity only diode 106 is shown. Inserts maybe formed by stamping, molding or EDMing parts to be inserted into the region bounded by a diode bar on each side, or a diodebar and a side of an electrode. The number of inserts depends upon the number of radially spaced bars. Generally there is one more inserts than the number of diodes due to the fact that one of the inserts is split down the middle to form two. This split insert forms cathode and anode electrodes. In the preferred embodiment four plus one split inserts are employed. This is offered by way of example and not limitation. Contact 701 is shown in its relaxed or non-installed state. Contact 702 is shown under compression contacting the cathode 513 (FIG. 5) of installed diode bar 106. Inside radius of electrode forms a reflector with the focal point at the center 609 of rod 101. Inside surface(s) 703 are coated with a reflective material such as gold in the preferred embodiment. This is offered by way of example as other material such as silver or copper may be used. Directly on top of each diode is spacer made of the preferred BK7, BeO or diamond may also be considered. Dielectric insulator 111 provides mechanical support, rear diode facet contamination protection and exact spacing between adjacent inserts 700 and 755. Electrode fingers 751 contact "P" side or anode of array 106. Insert body 750 accepts foil or wire termination 753 for connection to external power source. Pyralex™ (P/N LF7021 Dupont, Wilmington, Del. USA) dielectric insulator 754 with or without adhesive or some other dielectric such as plastic sheet isolates insert halves 755 and 750. Insulator 754 is inserted into slots 204 and 224 (FIG. 2, 2A). This material is offered by way of example and not limitation. A solid dielectric insulator 754 is inserted into slot(s) 204 (FIG. 2) and 224 (FIG. 2A). Insert half 750 is inserted between insulator 754 and diode 106 and second insulator 111. Other suitable materials may be selected for high frequency loss or other dielectric properties required by the application. The plug or insert is bonded into place using a filled epoxy (EMI, Breckenridge, Colo.) with the bond-line following a path around the perimeter of the "top" of the plug-insert. This perimeter will be bounded by the End Caps 200 and 220 (not shown) on each end and either the artificial diodes/dielectric insulators 107–111 on each side, or an artificial diode and a side of the electrode/insert. Electrode finger 752 connects to cathode 513 of diode 106 not shown. Micro-flow channels in the range 0.001" to 0.025 704 are formed by the gap between the reflective surfaces 703 and the rod 101 0.01" was used in the preferred embodiment. The micro-channel allows very efficient cooling of the rod 101 and insert(s) 700, 750 and 755. The sides of the insert near the diodes and the rod are recessed approximately 0.010" to allow for coolant flow in this region 720 forming additional micro-flow channels. Micro-channels are in the range of 0.001" to 0.0025", the preferred embodiment channels are approximately 0.010" (0.4 mm). The micro-channel compresses the boundary layer thus improving heat transfer. The micro-channel allows very efficient heat removal from the diode array(s) 102–106 and insert(s) 700, 750 and 755. Heat transfer rate may be further enhanced by the addition of particles most preferably below 10 nanometers in circumference or diameter. Researchers in Germany have used particles as large as approximately 10 nanometers, and have succeeded in doubling the thermal conductivity of water using aluminum particles. Researchers in Japan have used approximately 15 nanometers diameter $Al_2O_3$ particles and have increased the thermal conductivity of water approximately 30%. Researchers in America have used particles of $Al_2O_3$, CuO, Cu, and AI and increased thermal conductivity of water by approximately 30% to 40%. Therefore, it is well established that dielectric as well as metal nano sized particles in water in percentages between approximately 1% to 15% can greatly increase the thermal conductivity of water. Diamond particles could also work well due to their high thermal conductivity. Other ceramics with high thermal conductivity include SiN, AIN, SiC and BeO. Another novel aspect of the instant invention is the use of these fluids with nano or pico sized particles in a compact laser diode array assembly for the purpose of enhanced heat removal. The preferred embodiment encompasses the use of approximately 100 nm diameter diamond (either natural or synthetic) particles in an approximate ratio of 1 part diamond to 10 parts water. It is understood that both the size (diameter or average circumference, i.e., non-spherical) and the volume fractions are approximate. This is offered by way of example and not limitation as other materials enhance heat removal as well. In general, smaller diameters and larger fractions of particles as well as non-sphericity increase thermal conductivity more. In yet another embodiment, gold particles are used. These gold particles may be found in highly concentrated colloidal solutions (Ted Pella, Inc. #EMGC15). Metal particles increase thermal conductivity of water well; however, there are issues concerning oxidation. These issues can be solved with acids in the water and/or surfactants and/or coatings on the particles. Carbon particles (such as buckey balls) with a thin polymer or gold coating may work well. Ceramic particles may be purchased from Nanophase (Burr Ridge, Ill.), as well as MTL (Oakland, Calif.). Diamond particles may be purchased from, Ultradiamond Technology, (Bedford, Mass.), Vacuum Metallurgical (Japan), or Amples (Worcester, Mass.). It is often advantageous to introduce the particles into the water directly during manufacture of the particle. These processes include vacuum/inert atmosphere vaporization as well as the hot filament manufacturing technique for diamond whereby the formed diamond particles fall directly into water. They may also be mixed into water directly from powder form. In the preferred embodiment the water with a 10% addition of less than 10 nm diameter diamond preferably <5 nm particles is circulated through the cooling and micro-channels. Other particle types and combinations might include gold, silver, copper, SiC, SiN, AIN all of which may or may not be covered with a coating. This coating may be a polymer, ceramic or metal. Due to the very small volume of invention the use of premium coolants adds very little to the cost. Fluids other than water (with or without particles) may be flowed through the flow channels. In one embodiment, a fluid such as methanol or a refrigerant such as Fluorinert may be advantageously used. This fluid would have a boiling point that is advantageously selected to be near or correspond to the temperature that the diodes optimal wavelength for gain medium absorption would be. One such fluid is methanol that boils at 64.7 C. If the diodes operated at 2 C at 798 nm in pulsed mode, then at 64.7 C they would operate at about 811 nm. This is in the middle of the absorption band for Nd:YALO. By selecting the diode nominal wave length at nearly or just below the coolant boiling point temperature. Precise wavelength stability can be maintained without complex temperature controls. The fluid will boil off the diodes and rod in the assembly at or near its boiling point and will then not allow the diodes to exceed this temperature by a significant margin. The fluid is recondensed downstream in a heat exchanger. Other fluid, diode temperature and rod/rare earth combinations may be selected. Water at atmospheric or sub-atmospheric pressure (as well as other fluids/pressures) is not excluded. The instant invention provides low cost and low resistance electrical connection methods to diode arrays and provides large contact area to assist in heat conduction and removal. Micro-channels for coolant with exceptionally low thermal resistance due to a narrowing of the boundary layer. Reflective focusing surfaces to direct the pump energy to the laser axis for enhanced beam symmetry and coupling efficiency. Precise diode array alignment and robust connections. Low electrical impedance for currents exceeding 100 amperes.

Minimal inductance allowing high frequency operation. The extremely compact design afforded by the unique insert design allows installation of high power lasers in many new applications. The rugged low inertia design also allows for use in high-G environments.

Figure 7A:
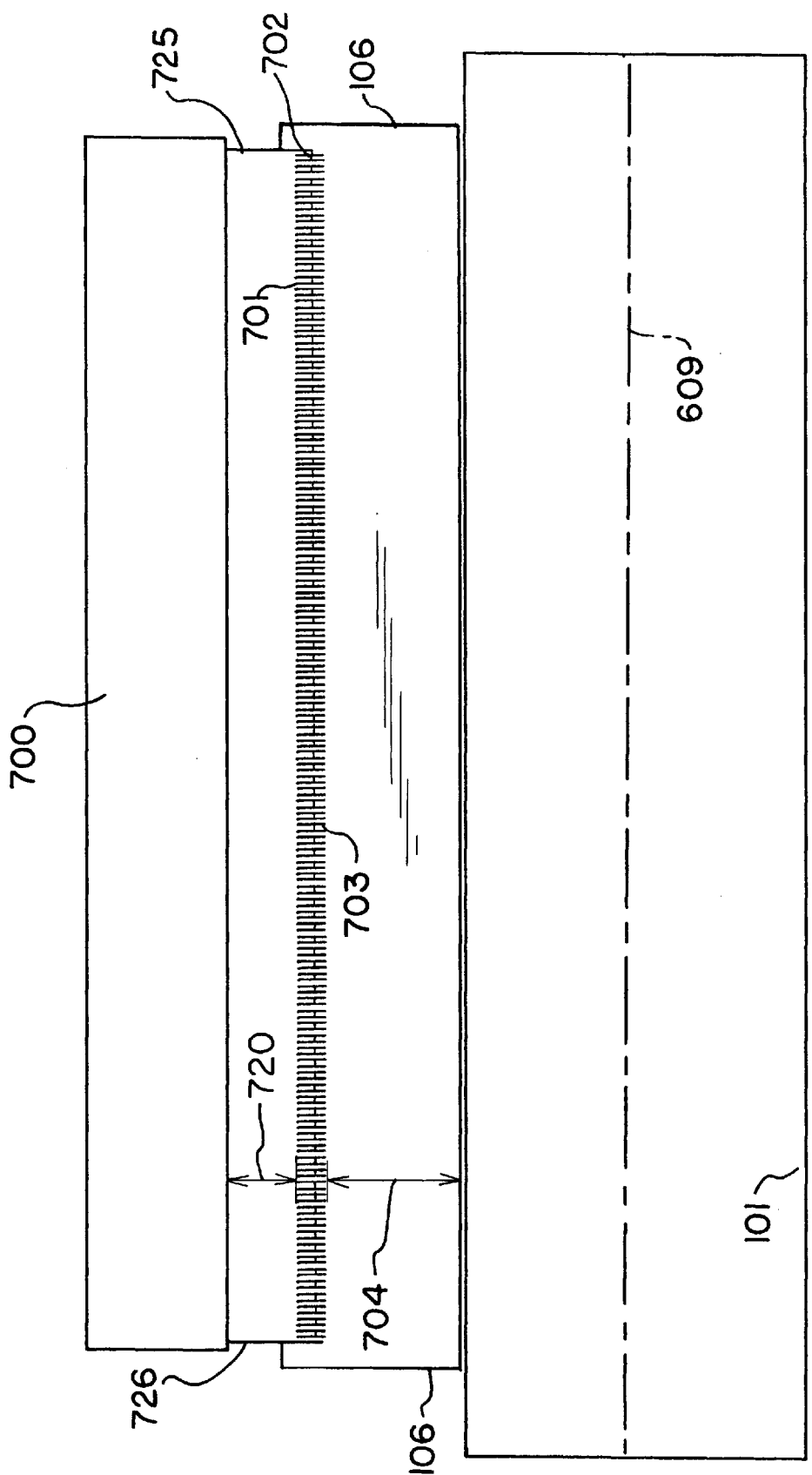
FIG. 7A is a detailed axial view of the electrode inserts and micro-cooling channels for the "fingers" alternate embodiment.

FIG. 7A is a detailed side view of the preferred insert bodies 700, 750 and 755 shown in FIG. 7. The symmetrical insert(s) form a conductive path between "P" and "N" contacts of adjacent diode arrays 102–106. For clarity only diode 106 is shown behind insert body 700. In the preferred embodiment four plus one split inserts are employed. This is offered by way of example and not limitation. Contact 701 is shown in its relaxed or non-installed state. Contact 702 is under compression contacting the cathode of diode array 106. Inside radius of electrode forms a linear reflector with the focal point at the center 609 of rod 101. In the preferred a 0.0002" copper film is platted on fingers 702 to add stiffness to increase contact force. Surface 703 is coated with a reflective material such as Gold in the preferred embodiment. This is offered by way of example as other material such as silver or aluminum may be used. Micro-flow channels 704 are formed by the gap between the reflective surfaces 703 and the rod 101 are approximately 0.010" (0.4 mm). Micro-channels allow very efficient cooling of the rod 101 contacts 701–702, and insert bodies 700, 750 and 755. Additional micro-flow channels 720 are formed by the gap between the insert body(s) and the diode array(s) 102–106 channels are approximately 0.010" (0.4 mm). The micro-channel allows very efficient heat removal from the diode array(s)bar(s) 102–106 contacts 701–702, and insert body(s) 700, 750 and 755. The micro-flow channels terminate at 725 and 726 for coolant path to end caps 200 and 220 not shown. The instant invention provides a low cost and low resistance electrical connection method for diode arrays. It also provides a large contact area to assist in heat conduction and removal. Micro-channels for coolant with exceptionally low thermal resistance are taught. Reflective focusing surfaces to direct the pump energy to the laser axis for enhance beam symmetry and coupling efficiency are taught. Precise diode array alignment and robust connections are taught. Low electrical impedance for currents exceeding 100 amperes are taught. Minimal inductance allowing high frequency operation are taught. The extremely compact design afforded by the unique insert design allows installation of high power lasers in many new applications. The rugged low inertia design also allows for use in high-G environments.

Figure 7B:
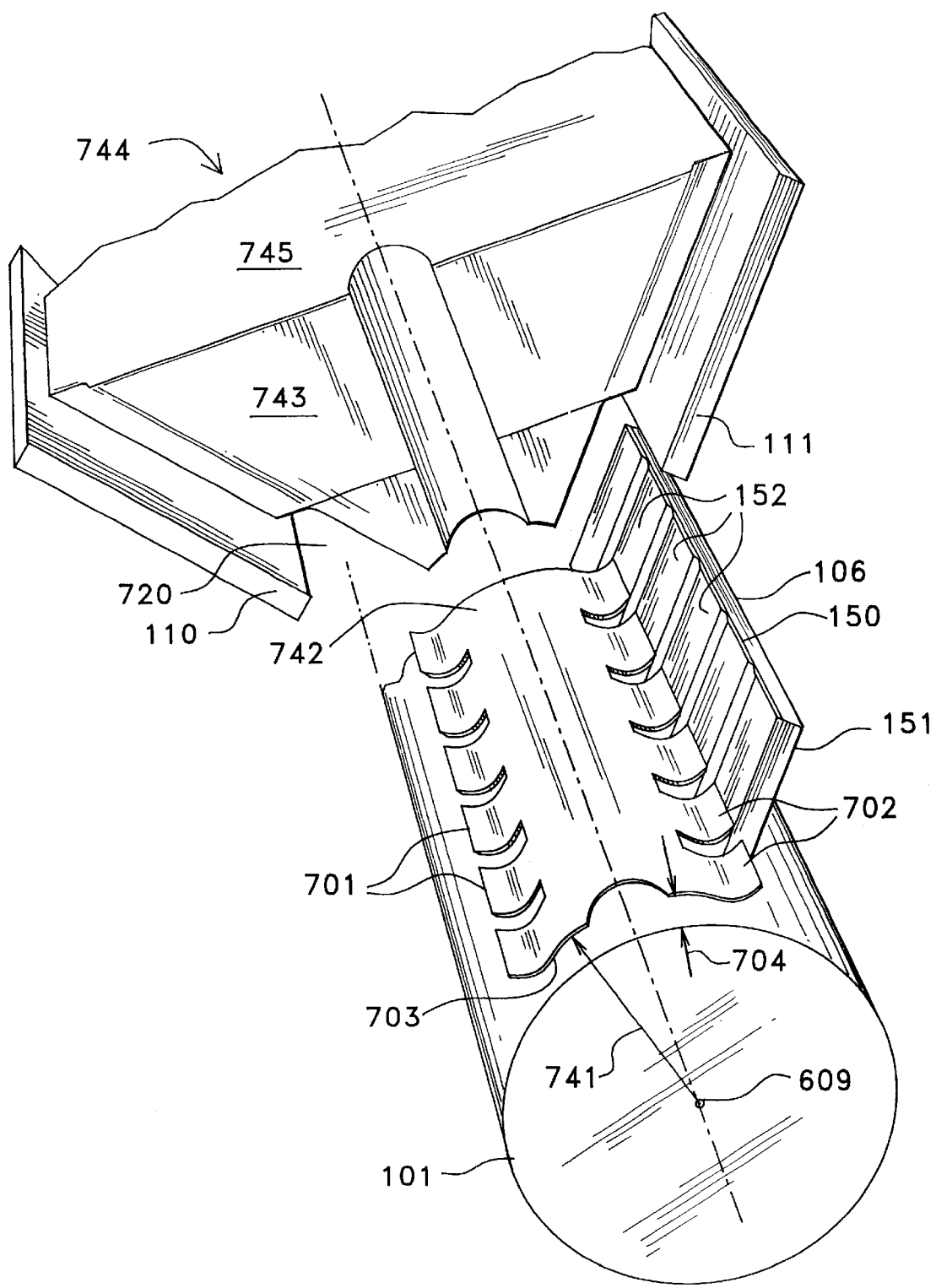
FIG. 7B is a detailed perspective view of the alternate "fingers" embodiment foil electrode inserts and micro-cooling channels.

FIG. 7B is a detailed exploded view of the alternate electrode/insert. Thin Cu foil electrode 740 forms a conductive path between "P" 150 and "N" 151 contacts of adjacent diode array(s) 106. Electrode 740 is formed by stamping, photo-chemical etching, molding or EDMing. Radius 741 is formed by a rolling or stamping process. The drawing is magnified and not to scale. In the preferred embodiment fingers 701 and 702 are 60 um wide on 160 um centers, matching the diode array stripes 152 spacing shown in FIGS. 8A–D. The radius is equal to the radius of the laser rod 101 plus the desired micro-channel 704 thickness; thus forming a linear-reflector focusing the pump energy to the center 609. The thin electrode is made from copper foil in the preferred embodiment. This is offered by way of example as other materials such as silver or combinations of materials may be used. The thin electrode 740 is attached to body 743 by suitable means. The completed assembly is inserted into the region bounded by a laser diode on each side. The number of plugs/inserts depends upon the number of radially spaced diodes. Generally there is one more plug than the number of diodes due to the fact that the termination electrode/insert splits one plug in two (See FIG. 7D). In the preferred embodiment four plus one split inserts are employed. Is this offered by way of example and not limitation. Contacts 701 are shown in relaxed or non-installed position. Contact 702 is shown under compression contacting the anodes stripes 152 ("P") of diode array 106. Contact 701 would contact the cathode "N" side of the next diode not shown. Inside radius 741 of electrode forms a reflector with the focal point at the center 609 of laser rod 101. Polished inside surface 703 is coated with an appropriate reflective material such as Gold in the preferred embodiment. In some applications the entire electrode may be plated with gold or other suitable material to eliminate chemical reactions with the coolant. Electrodes may be selectively plated to minimize ohmic resistance and metal migration with the diode contacts. Top surface 742 is prepared with SN (tin) for low temperature soldering to the insert body, or prepared to accept adhesives for bonding to body 743. The electrode may be fastened by spot welding or ultrasonic welding to the molded, cast, EDMed, or machined insert 743. The insert body may be solid Cu as in the preferred embodiment. Plastic, metal or suitable material with stable dimensional properties may be used. Directly on top of each diode is an artificial diode 111 and 110 made of a dielectric material. Insulators 111 and 110 provide mechanical support, exact spacing and ohmic isolation between adjacent inserts. Electrode fingers 702 contact "P" side or anode of array 106. The plug or insert 743 is bonded into place using a filled epoxy (EMI, Breckenridge, Colo.) with the bond-line following a path around the perimeter of the "top" of the plug-insert 745. This perimeter 745 bounded by the End Caps 200 and 220 (not shown) on each end and artificial diodes/diode spacers 107–111 on each side. Micro-flow channels 704 are formed by the gap between the reflective surfaces 703 and the rod 101 are in the range 0.001 to 0.025" the preferred embodiment is 0.010" (0.4 mm). The micro-channel allows very efficient cooling of the rod 101, electrodes 740 and diode(s) 106. The sides of the insert near the diodes and the rod are recessed approximately 0.010" to allow for coolant flow in this region 720 forming additional 0.010" (0.4 mm) micro-flow channels. Micro-channels are in the range of 0.001–0.0025". The micro-channel compresses the boundary layer thus improving heat transfer. The micro-channel allows very efficient heat removal from the diode bar(s) 102–106 and insert(s) 743. Heat transfer rate may be further enhanced by the addition of particles most preferably below 10 nanometers in circumference or diameter as taught in FIG. 7. In the preferred embodiment the water with a 10% addition of less than 10 nm diameter diamond particles is circulated through the cooling and micro-channels. Reflective focusing surfaces directs the pump energy to the laser axis for enhance beam symmetry and coupling efficiency. Foil electrodes allow precise diode array alignment and robust connections. Inserts made from light weight materials allow further weight reductions without significant thermal penalties. Dielectric inserts reduce capacitance permitting operation at higher frequencies than solid metallic construction. The low electrical impedance allows for high current operation exceeding 100 amperes. Minimal inductance allowing ultra short pulse operation. The extremely compact design afforded by the unique insert and electrode design allows installation of high power lasers in many new applications. The rugged low inertia design also allows for use in extreme high-G environments.

Figure 7C:
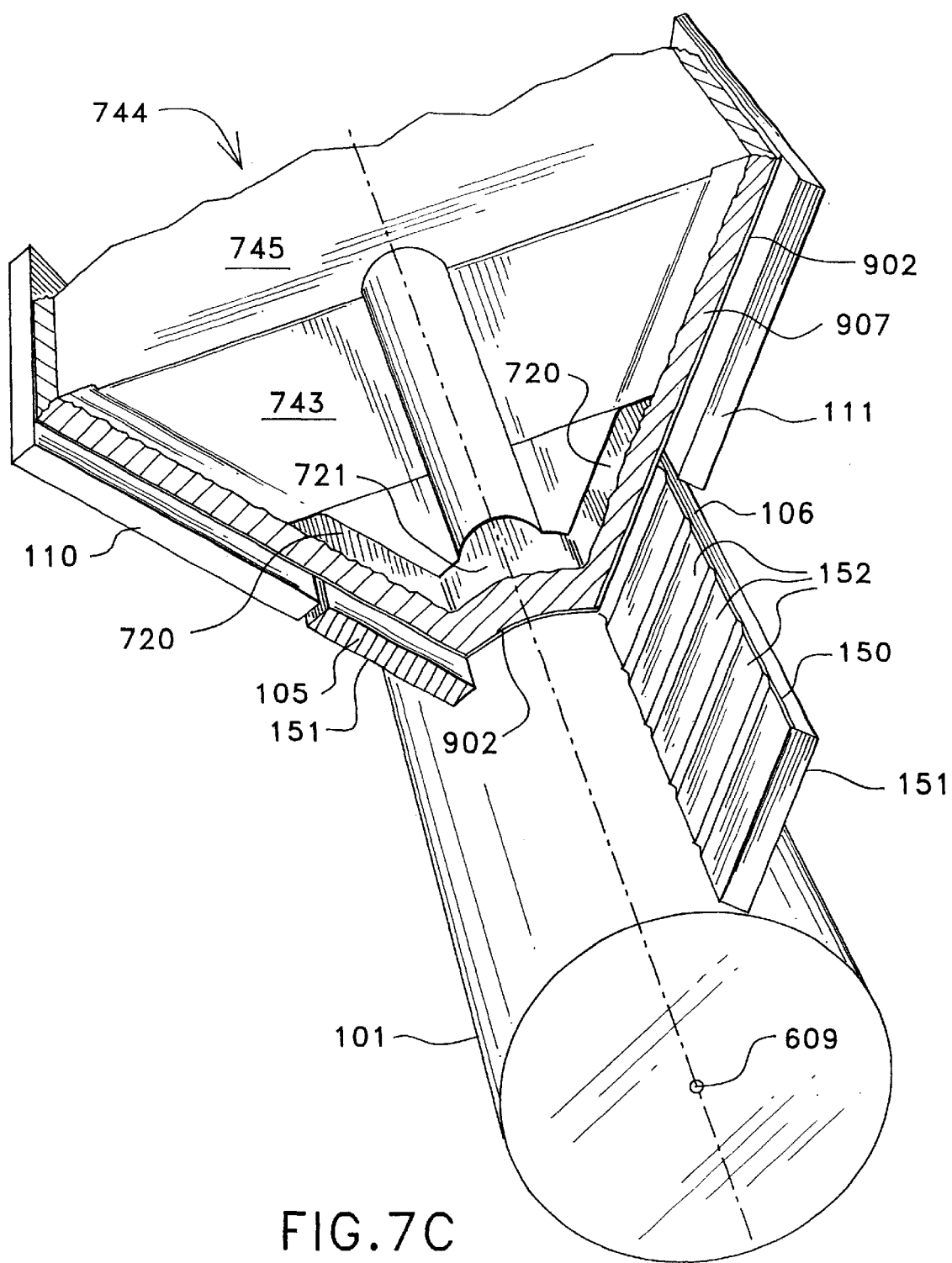
FIG. 7C is a cutaway view of the preferred embodiment (coated) insert.
Figure 8C:
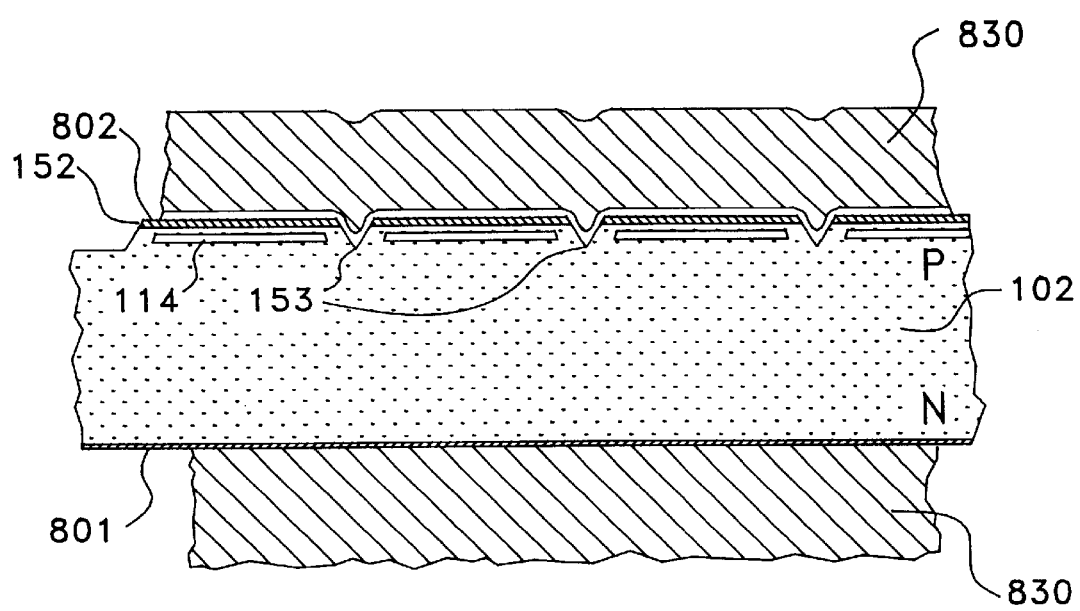
FIG. 8C is a magnified view of the "glue" (conductive adhesive) connection.

FIG. 7C is a cutaway view of the preferred insert 744. Previously applied conductive films 902 and 907 form a conductive path between "P" 152 and "N" 151 contacts of adjacent diode arrays 105 and 106.

Electrode 744 is formed by stamping, photo-chemical etching, molding or EDMing. The drawing is magnified and not to scale. Film 902 and 907 deposited on rod 101 forms a linear-reflector focusing the pump energy to the center 609. Thin electrode 907 is deposited by vacuum and or electroplated copper in the preferred embodiment. This is offered by way of example, as other materials such as silver or combinations of materials may be used. The number of plugs/inserts 744 depends upon the number of radially spaced diodes. Generally, there is one more plug than the number of diodes due to the fact that the termination electrode/insert splits one plug in two (see FIG. 7). In the preferred embodiment four plus one split inserts are employed. This is offered by way of example and not limitation. Titanium adhesion layer 902 is coated with an appropriate reflective material such as gold in the preferred embodiment. In some applications, the entire electrode may be plated with gold or other suitable material to eliminate chemical reactions the coolant. Directly on top of each diode is an artificial diode 111 and 110 made of a dielectric material. Insulators 111 and 110 provide mechanical support exact spacing and ohmic isolation between adjacent inserts. After plating the plug or insert 744 is bonded into place using a filled epoxy (EMI, Breckenridge, Colo.) with the bond-line following a path around the perimeter of the "top" of the plug-insert 745. This perimeter 745 bounded by the end caps 200 and 220 (not shown) on each end and artificial diodes/diode spacers 107–111 on each side. Micro-flow channels 721 are formed by the gap between the coating 907 and the insert 744 are in the range 0.001 to 0.025". The preferred embodiment is 0.010" (0.4 mm). The micro-channel allows very efficient cooling of the rod 101, conductive film 907 and diode(s) 105–111. The sides of the insert near the diodes and the rod are recessed approximately 0.010" to allow for coolant flow in this region 720 forming additional 0.010" (0.4 mm) micro-flow channels. Micro-channels are in the range of 0.001"–0.0025". The micro-channel compresses the boundary layer, thus improving heat transfer. Heat transfer rate may be further enhanced by the addition of particles most preferably below 10 nanometers in circumference or diameter as taught in FIG. 7. In the preferred embodiment the water with a 10% addition of less than 10 nm diameter diamond particles is circulated through the cooling and micro-channels. Reflective focusing surfaces direct the pump energy to the laser axis for enhance beam symmetry and coupling efficiency. Inserts 744 made from light weight materials allow further weight reductions without significant thermal penalties. The extremely compact design afforded by the unique insert and film electrode design allows installation of high power lasers in many new applications. The rugged low inertia design also allows for use in extreme high-G environments.

The inserts may be of stamped or molded material with a chemically etched foil sheet attached by ultrasonic welding (or other attach method) at the bottom radiused portion. The foil sheet is chemically etched (or dry etched) so that the fingers may be numerous (several hundred), as well as small (0.001"–0.005") gaps between each finger. The foil may be aligned to the inserts using pins in a fixture. If etched pockets are made in the foil to accept these pins, precise location may be maintained between the foil and the insert as long as female pockets for pin location are made in the inserts. The foil may also act as a pump light reflector as long as it is polished and copper, silver, or gold coated.

FIG. 8 is magnified cutaway of the diode bar ohmic connections. Diode bars 102–106 may have 1–100 emitters per bar. In the preferred embodiment 1 cm long (1000 um) aluminum free bars with 60 emitters are used. Bars manufactured by Coherent-Tutcore (Tampere, Finland) are offered by way of example, not as limitation. During manufacture of the bars a thin 100-nm layer 801–802 of gold is applied, providing ohmic contact. To insure a lower resistance contact and uniform current distribution an additional thick layer(s) is added. Poor current distribution leads to "hot spots", resulting in undesirable wavelength shifts and reduced diode life. In the preferred embodiment the final metal layer 907 is very thick as taught in FIG. 13 and optional electroplate process FIG. 16. The final film 810 is a composite of adhesion, reflective and thick conduction layers. Optional copper Electro-plate process (FIG. 16) ads to the last vacuum applied layer. Final thickness 1–25 um is desired, 12 um is used in the preferred embodiment. In the preferred embodiment application of titanium adhesion 902, gold reflective 903 and copper conduction 907 layers are taught in FIG. 9. In this way the composite conductive film serves three purposes. One, as reflector to focus pump energy to the center of the laser 101. Two, heat conduction to the micro-channel and coolant. Three, low resistance connection to diode arrays and external power.

FIG. 8A is a magnified view of the alternate diode finger termination. Fingers 701–702 formed from foil sheet by chemically etching (or dry etched) may be numerous (several hundred), as well as small (0.001"–0.005"). In the preferred embodiment fingers are on 160 um centers and are 50 um wide contacting the center of each stripe. Emitter stripes 152 are 150 um wide with a 10 um isolation grove 153. Like wise mirror finger contacts (not shown) are made to the "N" contact 151.

FIG. 8B is a magnified view of the alternate diode bar termination. An alternate embodiment the diode bar ohmic contact, is made with a solid bar or rod 840 to mesas. In the preferred embodiment the bar is made from silver or gold alloy. These materials are offered by way of example and not limitation. Like wise mirror contacts (not shown) are made to the "N" contact 151.

FIG. 8C is magnified cutaway of and alternate diode bar ohmic connections. An alternate embodiment to vacuum deposition FIG. 8 is the use of conductive adhesives or thick films. Conductive pastes of silver or copper are offered by way of example and not limitation. The final film may be baked, UV cured to bond to the diode bar 102. Diode bars 102–106 may have 1–100 emitters per bar. In the preferred embodiment 1 cm long (1000 um) aluminum free bars with 60 emitters are used. Bars manufactured by Coherent-Tutcore (Tampere, Finland) are offered by way of example, not as limitation. During manufacture of the bars a thin 100-nm layer 801–802 of gold is applied, providing ohmic contact. To insure a lower resistance contact and uniform current distribution conductive layers 830 are applied to both sides of diode bar and to rod. Thus improving current distribution and reducing "hot spots" minimizing undesirable wavelength shifts and enhancing diode life. In this way the conductive film 830 serves three purposes. First, as reflector to focus pump energy to the center of the laser 101. Second, heat conduction to the micro-channel and coolant. Third, low resistance connection to diode adjacent bars arrays and external power. The low temperature conducive-adhesive reduces temperature-induced stresses.

FIG. 9 is a detailed edge view of the preferred embodiment during the assembly and coating processes. Conductive films complete the ohmic connections between adjacent diodes radially dispersed around laser rod 101. For clarity the sandwich electrode 920 and only two diode arrays are shown. The drawing is not to scale to help teach the unique aspects of the instant invention. End pieces 200 and 220 (not shown) as described in FIG. 2 attached to rod 101 on each end using either UV OP30 or UV OP40 adhesive (Dymax, New Haven, Conn.). Diode bars 102–106, diode spacers 107–111 inserted and glued into the grooves 215–219. In the preferred embodiment temporary masking spacers 137 are slid into the same grooves 215–219. An alternate embodiment uses an ammoniatel latex (solder mask) cap 180 (FIG. 9) available from Chemtronix (Kenesaw, Ga.) applied to surface(s) 177 in place of the masking spacer(s) 137 (see FIG. 9). Masking spacer 137 and all solder mask is removed after the plating step FIG. 16. FIGS. 2, 6, 11 teach the assembly and application of UV cure optical adhesive OP30 or UV OP40, delivered via kapton capillary needle 1101 (FIG. 11). Correct application of adhesive is critical. The adhesive serves many purposes: One, it index matches the diode aperture(s) 114 to the rod 101. Secondly it mechanically secures the components. Thirdly it protects the facet from subsequent deposition operations. Fourthly it acts as a dielectric to prevent the conductive film from "shorting" the diode bar 102 or electrode 920. The low viscosity of the adhesive allows capillary action to "Wick" adhesive in to the voids. Electrode 920 (FIG. 17) is designed to take advantage of this capillary action. A unique fixture 1100 allows precise application of adhesive to just where it is needed. Such as down the grooves 215–219, rod-diode(s) interface 606, rear facet dielectric interfaces(s) 612, and electrode-rod interface 614, thus forming a nonconductive barrier layers 606, 607, 612,614 and bead 610, after masking (optional) and glue operations are complete. Sub-assembly 900 is ready for coating, is inserted into temporary cover fixtures 1301–1302. The cover fixtures protect the rod 101 from the cleaning and coating steps. In the preferred embodiment 20 nm Titanium adhesion layer 901 is applied. This is offered by way of example and not limitation. Followed by gold and or copper layer(s) 907 applied by common evaporative or sputtering process is applied to the assembly 900. These materials are offered by way of example and not limitation. FIG. 13 further details the fixturing and vacuum process. In this way the rod has a reflective coating in between each diode bar 102–106. The fixtures 1301–1302 (FIG. 13), masking spacer(s) 137 and or mask 180 are removed after the plating process (FIG. 16). Following the last metal deposition step. Two split inserts 771 are pushed into void between electrode 920 and adjacent diodes bar 102 and 106. Four inserts 744 are pushed into the remaining voids between the diodes forming micro channels 721. In an alternate embodiment, lower impedance may be achieved by inserting conductive type inserts such as 700 and 750 (see FIG. 5). The inserts are then put into position with a slight downward pressure. Inserts 770 and 771 are then UV glued into position using UV #3410 adhesive from EMI (Breckenridge, Colo.). Insert(s) define the micro channels 721. Inserts maybe formed by stamping, molding or EDMing. The number of inserts depends upon the number of radially spaced diodes. Generally there is one or more inserts 770 than the number of diodes due to the fact that the termination electrode/insert splits one plug in two 771. In the preferred embodiment four plus one split inserts are employed. This is offered by way of example and not limitation. Composite conductive film 907 forms a continuous layer connecting adjacent diodes "N" and "P" sides together. A subsequent plating step detailed in FIG. 16 builds up the conductive film to a final preferred thickness of approximately 0.0005". Inside radius of electrode 901 and 907 forms a reflector with the focal point at the center 609 of rod 101. A reflective material such Gold is used in the preferred embodiment is applied over the adhesion layer 901. This is offered by way of example as other material such as silver or copper may be used. Directly on top of each diode is an diode spacers 107–111 made of a dielectric material. Diode spacers 107–108 provides mechanical support, rear diode facet contamination protection, electrical isolation and exact spacing between adjacent inserts 770. Positive copper electrode 902 makes ohmic contact to films 901 and 907 ultimately terminating at diode bar 102 anode 152. Negative copper electrode 905 makes ohmic contact to films 901 and 907 ultimately terminating at diode 106 cathode 513. Copper is offered by way of example as other materials such as silver may be used. The electrode assembly 920 is a sandwich of copper foil (0.002" thick) conductors 902 and 905, adhesive layers 903 and Pyralex™ (P/N LF7021 Dupont, Wilmington, Del. USA) dielectric film insulator 904. Electrode assembly 920 provides terminations for connection to external power source. This material is offered by way of example and not limitation. Other suitable materials may be selected for high frequency loss or other dielectric properties required by the application. Prior to the potting operation, plug/inserts are bonded into place using a filled epoxy (EMI, Breckenridge, Colo.) with the bond-line following a path around the perimeter of the "top" of the plug-insert. This perimeter will be bounded by the End Caps 200 and 220 (not shown) and on each end and either the artificial diodes/diode spacers 107–111. The sides of the insert near the diodes and the rod are recessed approximately 0.010" to allow for coolant flow in this region 721 forming micro-flow channels. Micro-channels are in the range of 0.001–0.0025", channels are approximately 0.010" (0.4 mm) in the preferred embodiment. The micro-channel allows very efficient cooling of the rod 101, conductor 901 diodes 102–106. The micro-channel compresses the boundary layer thus improving heat transfer. Heat transfer rate may be further enhanced by the addition of particles most preferably below 10 nanometers preferred <5 nm in circumference or diameter. Researchers in Germany have used particles as large as approximately 10 nanometers, and have succeeded in doubling the thermal conductivity of water using aluminum particles. Researchers in Japan have used approximately 15 um diameter $Al_2O_3$ particles and have increased the thermal conductivity of water approximately 30%. Researchers in America have used particles of $Al_2O_3$, CuO, Cu, and AI and increased thermal conductivity of water by approximately 30% to 40%. Therefore, it is well established that dielectric as well as metal nano sized particles in water in percentages between approximately 1% to 15% can greatly increase the thermal conductivity of water. Diamond particles could also work well due to their high thermal conductivity. Other ceramics with high thermal conductivity include SiN, AlN, SiC and BeO. The preferred embodiment encompasses the use of approximately 100 nm diameter diamond (either natural or synthetic) particles in an approximate ratio of 1 part diamond to 10 parts water. It is understood that both the size (diameter or average circumference, i.e., non-spherical) and the volume fractions are approximate. This is offered by way of example and not limitation. As other materials enhance heat removal as well. In general, smaller diameters and larger fractions of particles as well as non-sphericity increase thermal conductivity more. In yet another embodiment, gold particles are used. These gold particles may be found in highly concentrated colloidal solutions (Ted Pella, Inc. #EMGC15). Metal particles increase thermal conductivity of water well; however, there are issues concerning oxidation. These issues can be solved with acids in the water and/or surfactants and/or coatings on the particles. Carbon particles (such as buckey balls) with a thin polymer or gold coating may work well. Ceramic particles may be purchased from Nanophase (Burr Ridge, Ill.), as well as MTL (Oakland, Calif.). Diamond particles may be purchased from, Ultradiamond Technology, (Bedford, Mass.) Vacuum Metallurgical (Japan) or Amples (Worcester, Mass.). It is often advantageous to introduce the particles into the water directly during manufacture of the particle. These processes include vacuum/inert atmosphere vaporization as well as the hot filament manufacturing technique for diamond whereby the formed diamond particles fall directly into water. They may also be mixed into water directly from powder form. In the preferred embodiment the water with a 10% addition of less than 10 nm diameter diamond preferably <5 nm particles is circulated through the cooling and micro-channels. Other particle types and combinations might include gold, silver, copper, SiC, SiN and AlN all of which may or may not be covered with a coating. This coating may be a polymer, ceramic or metal. Due to the very small volume used in the invention the use of premium coolants adds very little to the cost. Fluids other than water (with or without particles) may be flowed through the flow channels. In one embodiment, a fluid such as methanol or a refrigerant such as Fluorinert may be advantageously used. This fluid would have a boiling point that is advantageously selected to be near or correspond to the temperature that the diodes optimal wavelength for gain medium absorption would be. One such fluid is methanol that boils at 64.7° C. If the diodes operated at 20° C. at 798 nm in pulsed mode, then at 64.7° C. they would operate at about 811 nm. This is in the middle of the absorption band for Nd:YALO. By selecting the diode nominal wave length at nearly or just below the coolant boiling point temperature. Precise wavelength stability can be maintained without complex temperature controls. The fluid will boil off the diodes and rod in the assembly at or near its boiling point and will then not allow the diodes to exceed this temperature by a significant margin. The fluid is recondensed downstream in a heat exchanger. Other fluid, diode temperature and rod/rare earth combinations may be selected. Water at atmospheric or sub-atmospheric pressure (as well as other fluids/pressures) are not excluded. When coolant ($H_2O$, $H_2O$ with nano-diamond, dielectric fluid, gas, or air) is flowed through one end piece 200 and out the other 220, between the rod 721 and diodes 720. Power source 501 leads are attached to the protruding foils 902 and 905. Diodes emit energy in the pump head of the gain medium 101 and lasing commences between each dielectric stack mirror/facet that is applied to each end of the laser rod 101. The instant invention provides low cost and low resistance electrical connection methods to diode arrays. Provides large contact area to assist in heat conduction and removal. Micro-channels for coolant with exceptionally low thermal resistance due to a narrowing of the boundary layer. Reflective focusing surfaces to direct the pump energy to the laser axis for enhance beam symmetry and coupling efficiency. Precise diode array alignment and robust connections. Low electrical impedance for currents exceeding 100 amperes. Minimal inductance allowing high frequency operation. The extremely compact design afforded by the unique insert design allows installation of high power lasers in many new applications. The rugged low inertia design also allows for use in high "G" environments. Additionally the novel assembly and processing methods taught herein may be easily adapted to robotic assembly further improving repeatability and yields.

The sides of the insert near the diodes and the rod are recessed approximately 0.010" to allow for coolant flow in this region 721 forming micro-flow channels. Micro-channels are in the range of 0.001–0.0025", channels are approximately 0.010" (0.4 mm) in the preferred embodiment. The micro-channel allows very efficient cooling of the rod 101, conductor 901, diode bars 102–107. The micro-channel compresses and thins the boundary layer thus improving heat transfer. Heat transfer rate may be further enhanced by the addition of particles most preferably below 10 nanometers preferred <5 nm in circumference or diameter. When coolant ($H_2O$, $H_2O$ with nano-diamond, dielectric fluid, gas, or air) is flowed through one end piece and out the other, between the rod, diodes, and inserts and current leads are attached to the protruding foils 902 and 905 from each half insert, the diodes emit energy in the pump head of the gain medium and lasing commences between each dielectric stack mirror/facet that is applied to each end of the laser rod.

The instant invention provides low cost and low resistance electrical connection methods to diode arrays. Provides large contact area to assist in heat conduction and removal. Micro-channels for coolant with exceptionally low thermal resistance due to a narrowing of the boundary layer. Reflective focusing surfaces to direct the pump energy to the laser axis for enhance beam symmetry and coupling efficiency. Precise diode array alignment and robust connections. Low electrical impedance for currents exceeding 100 amperes. Minimal inductance allowing high frequency operation. The extremely compact design afforded by the unique insert design allows installation of high power lasers in many new applications. The rugged low inertia design also allows for use in high "G" environments. Additionally the novel assembly and processing methods taught herein may be easily adapted to robotic assembly further improving repeatability and yields.

Figure 10:
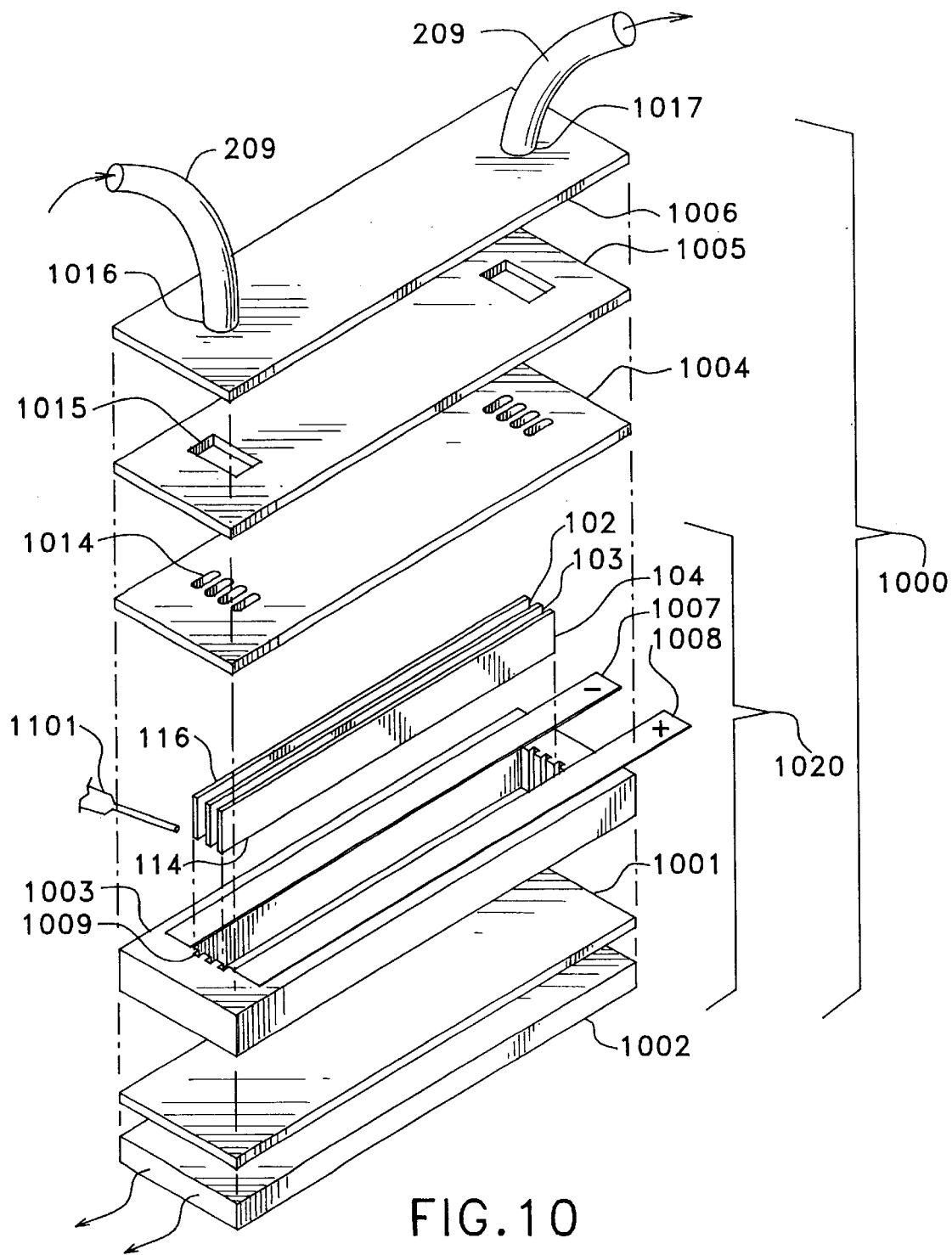
FIG. 10 is an exploded view of an alternate slab laser embodiment.

FIG. 10 is an exploded view of the alternate slab laser embodiment 1000. Grooves 1009 align the diode array(s) perpendicular to thin quartz window 1001. Diode bars 102-4 are inserted such that the emitting edge 114 contacts the window 1001. Small amounts of optical adhesive are applied with fixture 1100 (see FIG. 11) to array-window interface and groove(s) 1009. An alternate embodiment is where window 1001 is replaced with a gain medium such as a slab of ytterbium YAG. Solder mask available from Chemtronix (Kenesaw, Ga.) is applied to protect the rear facet(s) 116 during metal deposition processes. Mask is removed after the plating step FIG. 16. Other solder mask materials may be used, this is offered by way of example and not limitation. In the preferred mask is selectively applied to frame 1003 and cap 1004 providing electrical isolation. Titanium adhesion 902, gold reflective 903 and copper conduction 907 layers are applied to frame 1003 with diodes installed on to window/gain medium 1001. Vacuum metal deposition operations provide ohmic contact between adjacent diodes and from diode bar 102 and 104 to electrodes 1007 and 1008. Diodes are installed such that adjacent side alternate polarity thus forming a series circuit. In the preferred embodiment three diodebars are offered by way of example and not limitation. This configuration will support one to N arrays. Groove 1009 wraps around diode bar(s) 102 insulating the "P" and "N" sides of the diode array, during subsequent metal deposition operations (FIG. 13, and FIG. 16). Diode spacers (not shown) may be inserted on top of diode bars so that adhesive (Op 40) may be "wicked" between the rear facet and diode spacer 612 (FIG. 9) to insulate and protect. Coolant port cap 1004 with micro-flow channel apertures 1014 is bonded to frame 1003 with adhesive. May also be bonded to diode spacers if installed.

Micro-flow channels are formed between adjacent diode arrays and frame 1003. Coolant port cap 1005 with flow channel apertures 1015 is bonded to cap 1004 with UV adhesive.). Top coolant port cap 1006 provides termination for coolant tubes 209. External heat exchanger (not shown) connects to tubes 209. Laser pump assembly 1000 is bonded with optical adhesive to laser medium 1002. Due to the compact size of the instant invention a purality of pump sources 1000 may illuminate from 1–N surfaces of a gain medium. Such as a "Zig Zag" slab. In the preferred embodiment frame 1003 caps 1004–1006 are fabricated from a low expansion plastic. This material is offered by way of example and not a limitation as other materials such as ceramics have substantially equivalent properties and will perform similarly. This material was selected for its dimensional stability. Preferred embodiment frame 1003 caps 1004–1006 may be molded such as resin transfer molding or machined. Coolant exits port 1017 after flowing past laser rod 1001 and diode bar(s) 102–104. The pump will operate with one or more diode bars. The preferred embodiment employs three and is offered by way of example and not limitation. Laminated Teflon/stainless steel/polyurethane tube(s) 290 available (H V Technology 490 US Highway 11, Trenton, Ga.) are inserted and glued into ports 1016 and 1017. Other tubing materials may be used, this is offered by way of example and not limitation. The instant invention allows ease of assembly, precise component alignment, minimal part count and high cooling efficiency. Yielding a robust, extremely compact design with very high power densities. With unique design insures high yields and excellent repeatability are achieved. The assembly methods may be automated to further enhancing repeatability and reduce costs.

Figure 10A:
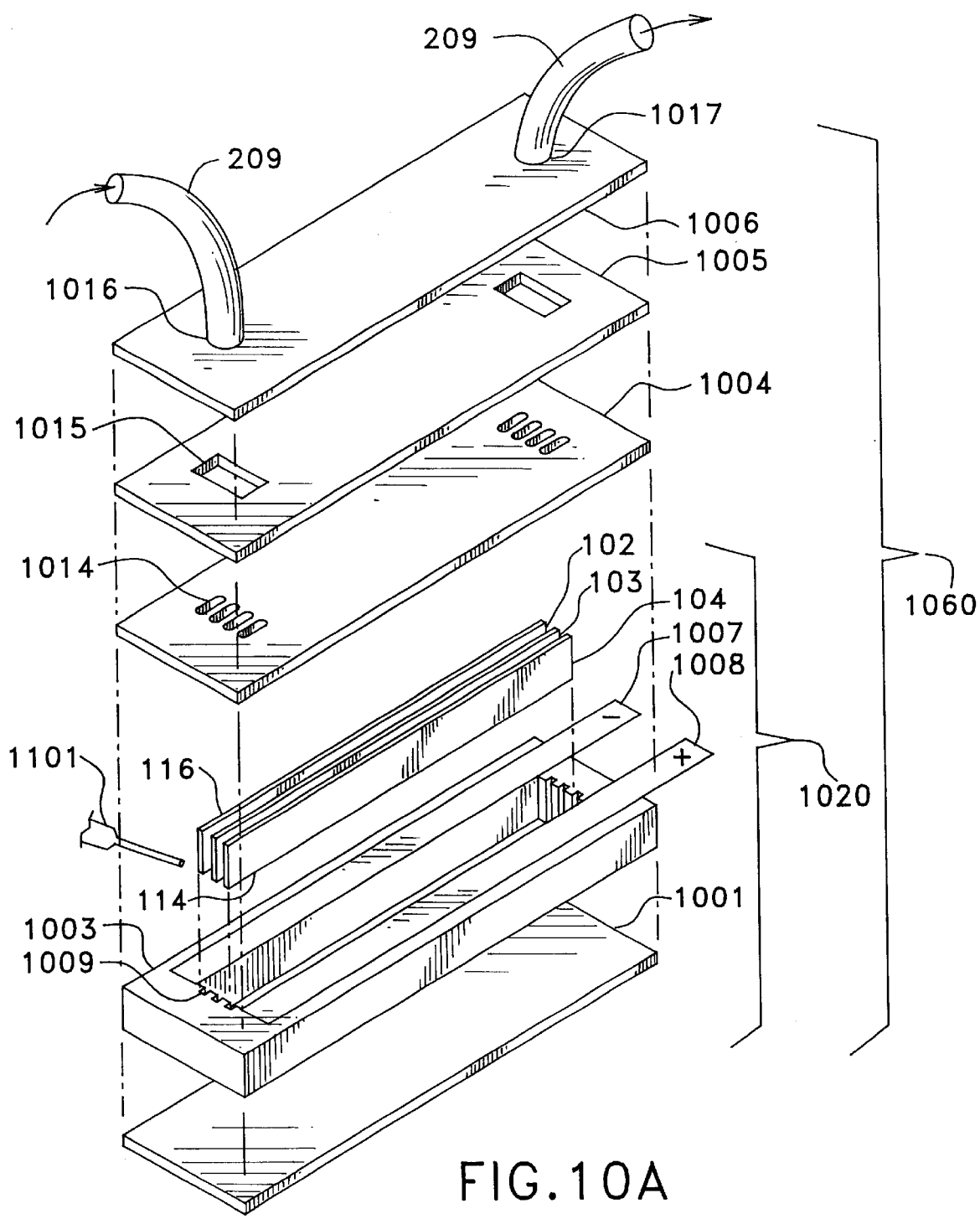
FIG. 10A is an exploded view of a flat laser diode array.

FIG. 10A is an exploded view of a flat laser diode embodiment 1060. Grooves 1009 align the diode bars(s) perpendicular to thin transparent window 1001. Diode bars 102-4 are inserted such that the emitting edge 114 contacts the window 1001. Small amounts of optical adhesive are applied with fixture 1100 (see FIG. 11) to array-window interface and groove(s) 1009. Conductive inserts 1062–1064 provides ohmic contact between adjacent diodes bars. Electrodes 1007 and 1008 extend in to frame 1009 contacting bars. Diodes bars are installed such that adjacent sides alternate polarity thus forming a series circuit. In the preferred embodiment three diode bars are offered by way of example and not limitation. This configuration will support one to N arrays. Groove 1009 wraps around diode bar(s) 102 insulating the "P" and "N" sides of the diode array, during optional metal deposition operations. Optional diode spacers (not shown) may be inserted on top of diode bars so that adhesive (Op 40) may be "wicked" between the rear facet and diode spacer to insulate and protect. Coolant port cap 1004 with micro-flow channel apertures 1014 is bonded to frame 1003 with adhesive. Micro-flow channels are formed between adjacent diode arrays and frame 1003. Coolant port cap 1005 with flow channel apertures 1015 is bonded to cap 1004 with UV adhesive.). Top coolant port cap 1006 provides termination for coolant tubes 209. External heat exchanger (not shown) connects to tubes 209. Laser pump assembly 1000 is bonded with optical adhesive to laser medium 1002. Due to the compact size of the instant invention a purality of pump sources 1060 may illuminate from 1–N surfaces of a gain medium 1088. Such as a "Zig Zag" slab. In the preferred embodiment frame 1003 caps 1004–1006 are fabricated from a low expansion plastic. This material is offered by way of example and not a limitation as other materials such as ceramics have substantially equivalent properties and will perform similarly. This material was selected for its dimensional stability. Preferred embodiment frame 1003 caps 1004–1006 may be molded such as resin transfer molding or machined. Coolant exits port 1017 after flowing past laser rod 1001 and diode bar(s) 102–104. The pump will operate with one or more diode bars. The preferred embodiment employs three and is offered by way of example and not limitation. Laminated Teflon/stainless steel/polyurethane tube(s) 290 are inserted and glued into ports 1016 and 1017. Other tubing materials may be used, this is offered by way of example and not limitation. The preferred coolant with nano particles enhances reduces thermal resistance. The instant invention allows ease of assembly, precise component alignment, minimal part count and high cooling efficiency. Yielding a robust, extremely compact design with very high power densities.

Figure 10B:
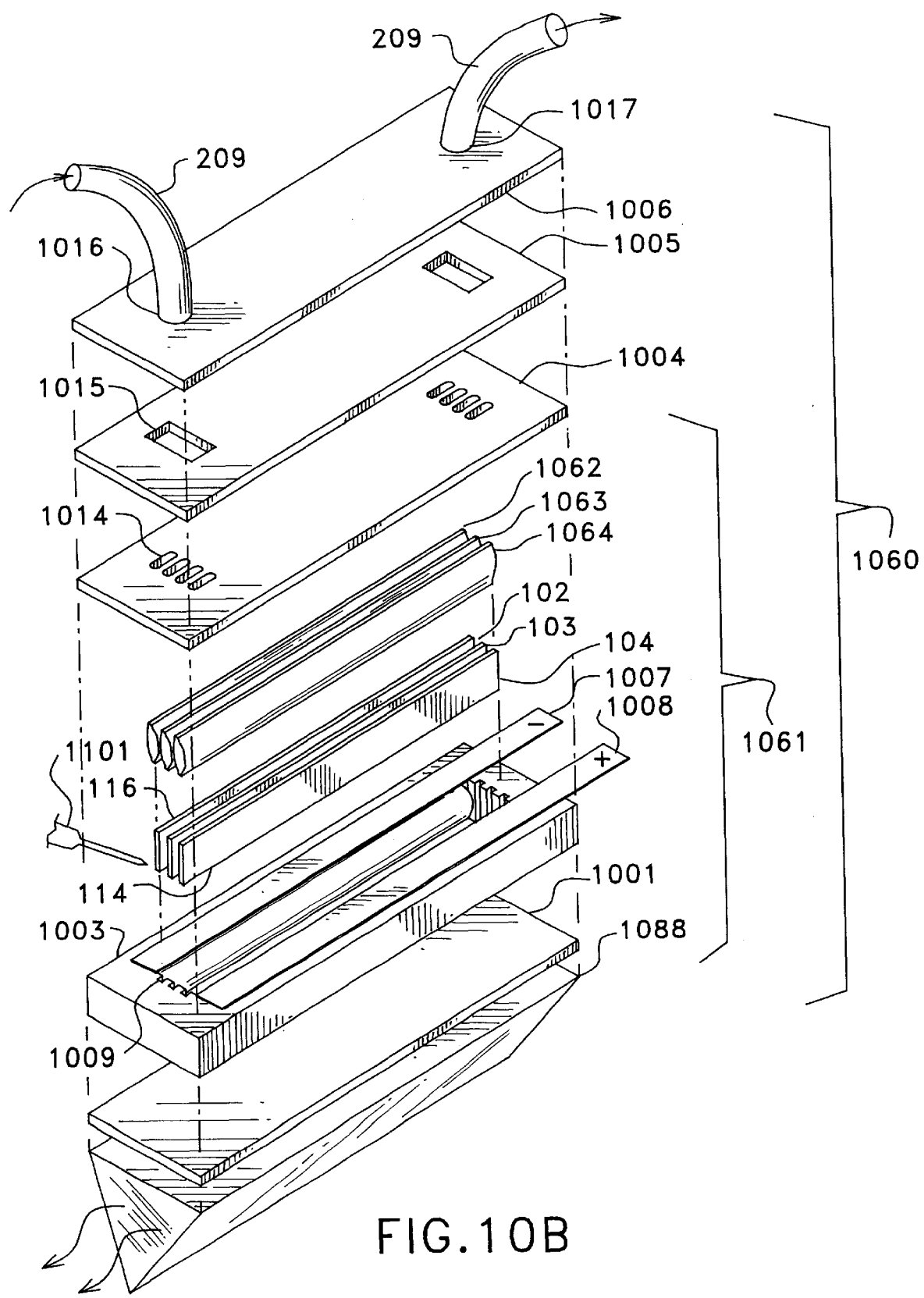
FIG. 10B is an exploded view of another embodiment of a flat laser diode showing diode spacers (107,108,109) to protect rear facets of diode bar.

FIG. 10B is an exploded view of the alternate slab laser embodiment 1040 with spacers. Grooves 1009 align the diode bars(s) perpendicular to thin quartz window 1001. Diode bars 102-4 are inserted such that the emitting edge 114 contacts the window 1001. Small amounts of optical adhesive are applied with fixture 1100 (see FIG. 11) to array-window interface and groove(s) 1009. An alternate embodiment is where window 1001 is replaced with a gain medium such as slab of ytterbium YAG. Grooves 1009 also align the diode spacers(s) perpendicular to the facet of diode bars 116. Spacers are inserted such that the facet 116 contacts the spacer(s) 107–111. Small amounts of optical adhesive are applied with fixture 1100 (see FIG. 11) to bar facet 116. Alternately solder mask available from Chemtronix (Kenesaw, Ga.) applied to 1019 prior to metal deposition processes. Mask is removed after metal deposition insuring electrical isolation between "P"—and "N" sides of bars. Titanium adhesion 902, gold reflective 903 and copper conduction 907 layers are applied to frame 1003 with diodes installed on to window/gain medium 1001. Vacuum metal deposition operations provide ohmic contact between adjacent diodes and from diode bar 102 and 104 to electrodes 1007 and 1008. Diodes are installed such that adjacent sides alternate polarity thus forming a series circuit. In the preferred embodiment three diode bars are offered by way of example and not limitation. This configuration will support one to N arrays. Groove 1009 wraps around diode bar(s) 102 insulating the "P" and "N" sides of the diode array, during subsequent metal deposition operations (FIG. 13, and FIG. 16). Diode spacers (not shown) may be inserted on top of diode bars so that adhesive (Op 40) may be "wicked" between the rear facet and diode spacer to insulate and protect. Coolant port cap 1004 with micro-flow channel apertures 1014 is bonded to frame 1003 with adhesive. May also be bonded to diode spacers 107–111 if installed. Micro-flow channels are formed between adjacent diode arrays and frame 1003. Coolant port cap 1005 with flow channel apertures 1015 is bonded to cap 1004 with UV adhesive.). Top coolant port cap 1006 provides termination for coolant tubes 209. External heat exchanger (not shown) connects to tubes 209. Laser pump assembly 1000 is bonded with optical adhesive to laser medium 1002. Due to the compact size of the instant invention a purality of pump sources 1000 may illuminate from 1–N surfaces of a gain medium. Such as a "Zig Zag" slab. In the preferred embodiment frame 1003 caps 1004–1006 are fabricated from a low expansion plastic. This material is offered by way of example and not a limitation as other materials such as ceramics have substantially equivalent properties and will perform similarly. This material was selected for its dimensional stability. Preferred embodiment frame 1003 caps 1004–1006 may be molded such as resin transfer molding or machined. Coolant exits port 1017 after flowing past laser rod 1001 and diode bar(s) 102–104. The pump will operate with one or more diode bars. The preferred embodiment employs three and is offered by way of example and not limitation. Laminated Teflon/stainless steel/polyurethane tube(s) 290 are inserted and glued into ports 1016 and 1017. The instant invention allows ease of assembly, precise component alignment, minimal part count and high cooling efficiency. Yielding a robust, extremely compact design with very high power densities. Many applications will benefit from a small, low cost, high performance source. Industries such as industrial, scientific, medical will find many uses for this instant invention. Applications like hair removal and fiber amplifiers will benefit from this device.

FIG. 11. Is detail of the optical adhesive applicator fixture. Fixture 1100 allows ultra precise application of optical adhesive to the assembly. The preferred embodiment is a manual platform with fine adjustment 1105. Body 1107 captures a syringe adhesive applicator 1103. The smallest standard 32-gage needle 1104 is connected to applicator 1103. The 32-gage needle is too large for precise application of very small amounts of the optical adhesive UV OP30 or UV OP40 (Dymax, New Haven, Conn.). To solve this problem a Polyimide-(Kapton) (H V Technology 490 US HY. 11, Trenton, Ga.) ultra fine capillary tube 1101 is installed inside the 32-gage needle 1104. The capillary tube is glued in place using a CA (supper Glue) adhesive. Compressed air 1120 enters foot-operated valve 1121 to actuate piston 1122 to dispense the adhesive. The operator may position the fixture to deliver adhesive to specific spots or traverse the length of the diode array 103 for a continuous bead. This bead is applied to the junction(s) 612 (FIG. 6) of the diode 103 facet and the dielectric insulator(s) 108. Another bead is applied to diode array-rod 101 interface junction 611. The adhesive is applied to the "N" or non-emitting edge, the capillary action wicks the adhesive to form very small bead 610. Thus the adhesive volume is minimized. After adhesive is applied to the desired locations UV lamp 1110 cures the adhesive at room temperature. The capillary delivery tube 1101 is placed under computer control with optical feed back to servo the position. The manual stages may be easily motorized. The precise nature and the excellent repeatability of this process lends its self to a robotic or automated process. Precise adhesive delivery may be accomplished with computer regulated air pressure. The adhesive application and curing process is done at room temperature thus minimizing temperature induced stress and deformation.

Figure 12:
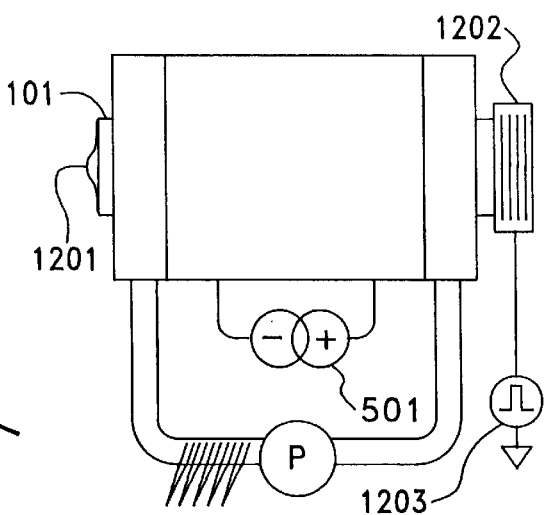
FIG. 12 is a laser embodiment having 100% reflecting replicated asphere and multi-layer electrically tunable mirror.

FIG. 12 is a laser embodiment using an aspheric lens to correct for thermal lensing. In this case the rod 101 could be made from Yb:YALO. Aspheric replicated lens 1201 with 100% reflective coating is bonded to rod 100. FIG. 22 discuses aspheric correction in further detail. Short cavity length's possible with the instant invention, are desirable for many pulsed solid-state laser application. "Cavity dumping" the laser is a particularly suitable application due to the short photo cavity round-trip time. The cavity may be "dumped" by an electrically tunable multilayer interference filter or photonic crystal 1202. If the laser is cavity dumped or q-switched using a voltage pulser 1203 a Fast Ionization Dynistor or other gallium arsenide based require fast rise time voltage pulser 1203 could be used. The Fast Ionization Dynister is available from Mega Pulse, Inc. (Alexandria, Va.). If CdTe or other electro-optic or photo refractive material is used in the alternate embodiment passive switch or the multi-layer electrically tunable switch these films can best be applies using Ion Beam Sputtering. The replicated asphere corrects for "thermal" distortion thus reducing beam diameter and improving M2.

FIG. 13 is teaches the vacuum coating process operation. The "masking caps" 1301 and 1302 are used only in the assembly of the lasers that receive a "seed" vapor deposited layer for subsequent electrolytic or electroless plating operations. Note that it is possible to vapor deposit only enough metal onto the assembly 1300 to carry the current without the need for a plating process. Among the vapor process 1302 are Cathodic Arc, Ion Arc, IBS, Evaporative, CVD and RF or Magnatron Sputtering. Caps 1301–1302 may be made from Al or plastic (if electro plating is not used). They have a recessed portion in the center that is slightly larger than the end caps 200 and 220 on each end of the laser rod. Note cap 220 is hidden from view by cover 1301. Covers 1301–1302 have "grooves" 1315–1319 machined in the raised periphery that are exactly aligned to the grooves in the end pieces 200 and 220 (FIG. 2). Around the circumference of the rod are five radially disposed laser diode bars 102–106, oriented such that the emitting facet is pointed towards the center of the rod. Five is offered by way of example and not limitation. Only diodes 102 and 103 are visible in this view. Following these diodes are the five diode spacers 107–111 that serve to protect the rear facet from coolant as well as any plating metal. Only 107 and 108 are visible in this view. Following the diodes spacers are five masking spacers 137–141. Only diodes 137 and 138 are visible in this view. These masking spacers keep any vaporized or plating metal from adhering to any portion of the assembly that could lead to a short circuit of the completed assembly. Because the current flows radially around the rod 101, through the diodes 102–106, it is imperative that the current can't circumvent the path through the diodes, i.e. go around the diodes. The masking caps and the masking spacers diodes are removed after the vacuum deposited seed layer and the electrolytic or electroless layer FIG. 16. To recap, there is a masking spacers behind every diode spacer, and there is also a dummy-dummy diode pushed up against the outer edge of the electrode tip. The masking spacers may first be inserted into the laser assembly before the masking caps 1301–1302 are applied followed by the final masking spacer for the electrode 136. Conversely, the masking caps may be applied followed by all the masking spacers. Instead of masking spacers, an ammoniatel latex cap 180 (FIG. 9) available from Chemtronix (Kenesaw, Ga.) may be applied in place of the masking spacers (as shown in FIG. 9) and removed after the plating step FIG. 16. Other solder mask materials may be used, this is offered by way of example and not limitation.

FIG. 13A is a detail view of the metal deposition fixture. End caps 1301 1302

Figure 14:
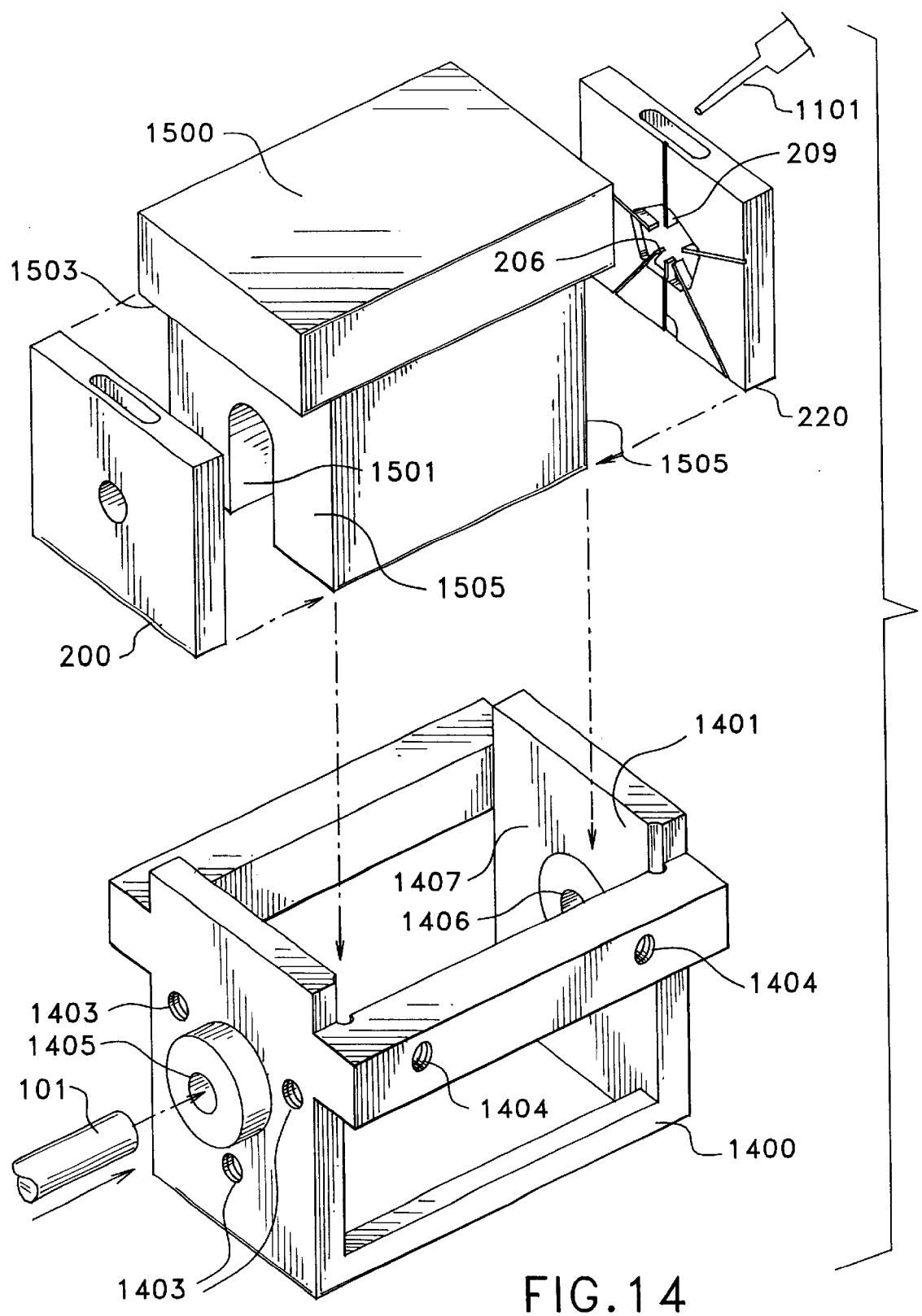
FIG. 14 is a detail view of the laser assembly "cage" fixture.

FIG. 14 is the laser assembly tooling fixture and assembly aid. The laser is assembled in a cage-like fixture 1400 that assures precise alignment of the end pieces 200 and 220 to the laser rod 101. The end pieces are slid into the open side of the cage 1401 and a gauge block 1500 is then inserted that provides the precise separation of the end pieces. When three 00-80 screws 1403 located on one end of the cage are tightened, they push end piece 200 into the gauge 1500 which in turn pushes on end piece 220 up tight against the far end of the cage. Two more 00-80 set screws 1404 are located in the cage such that, when they are tightened, they hold the end pieces in place. The gauge 1500 is then removed and the laser rod 101 can be slid through the open hole at the end of the cage 1405. Plastic insert 1406 stops the rod in the precise location. Padded "stopper" 1406 will not damage the end of the laser rod. With laser rod in position adhesive fixture 1101 applies UV OP40 (Dymax, Torrington, Conn.) adhesive to projections 209 securing the rod 101 to end pieces. The low viscosity adhesive insures excellent coverage by capillary "wicking" action. After the adhesive is UV cured, the cage 1400 fixture may be removed. In an alternate embodiment gauge block 1500 may be affixed to a motorized stage. Additionally alignment forces provided by screws 1404–1405 may be applied by common air or magnetic (solenoid) devices. The novel fixture allows ease of assembly and precise component alignment. Yielding a robust compact design. This method combined with the other unique manufacturing taught herein produces high yields and excellent repeatability. Many assembly steps maybe easily automated, further enhancing repeatability and reducing costs.

Figure 15:
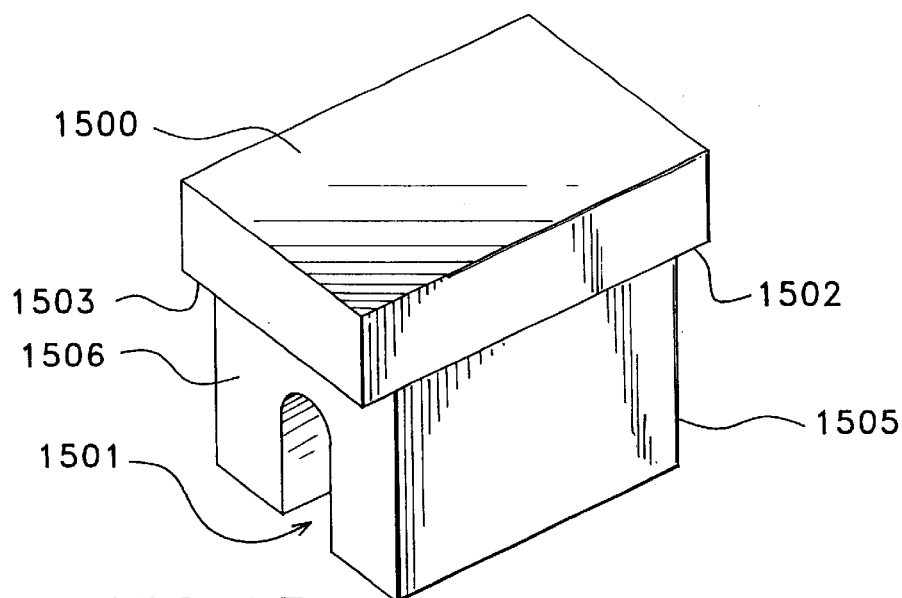
FIG. 15 is a detail view of the laser alignment gauge block.
Figure 16:
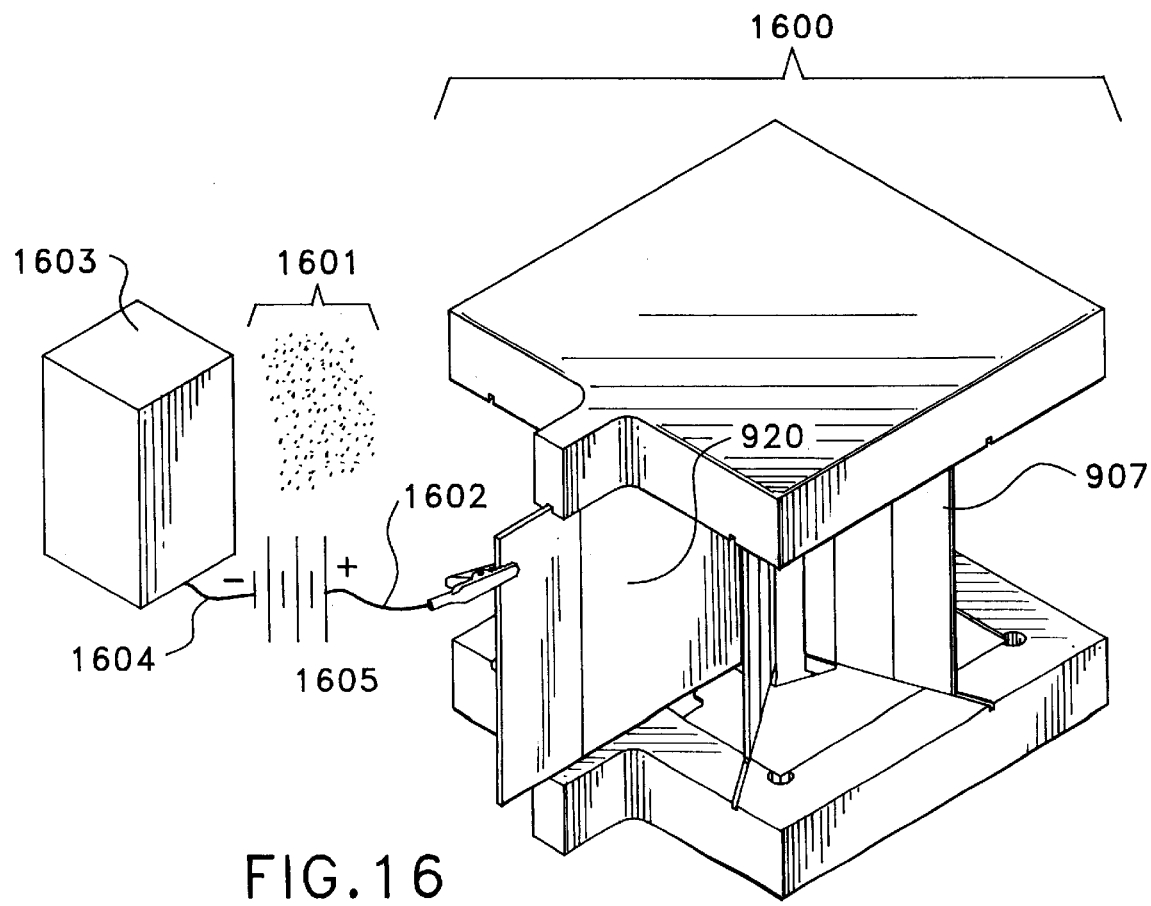
FIG. 16 teaches the method to apply additional electroplate process.

FIG. 15 is a prospective drawing of the gauge block assembly aid. The laser is assembled in a cage-like fixture 1400 (FIG. 14 not shown) that assures precise alignment of the end pieces 200 and 220 to the laser rod 101. The end pieces are slid into the open side of the cage 1401 and a gauge block 1500 is then inserted. Surfaces 1502–1503 fixes the depth the gauge sets into cage. Surfaces 1505–1506 provide the precise separation of the end pieces. Three 00-80 screws 1403 located on one end of the cage are tightened, they push end piece 200 into surface 1506 which in turn pushes surface 1505 against piece 220 up tight against cage surface 1407. Two more 00-80 set screws 1404 are located in the cage such that, when they are tightened, they hold the end pieces in place. The slot 1501 permits the laser rod 101 to be inserted through the open hole at the end of the cage 1405 to padded "stopper" 1406. Removal of 1500 allows adhesive to be applied as taught in FIG. 14. In an alternate embodiment gauge block 1500 may be affixed to a motorized stage for robotic or semi-automatic assembly. The novel fixture allows ease of assembly and precise component alignment. This method combined with the other unique manufacturing taught herein insures excellent repeatability. Much assembly's steps maybe automated reducing costs and improving yields.

FIG. 16 teaches the method to apply additional conductive to layers applied in FIGS. 9 and 13. The previous vacuum process allows surface preparation and precise application of a variety of materials. Vacuum process typically suffer from low application rates. Higher rates typically require high temperatures not desirable or compatible with some of the materials used. To increase the current capacity of the film 907 an electroplating process is used to build up the film to the final desired thickness. Additionally some diode manufactures apply very thin conductors to the arrays. Usually, laser diodes only, have a thin coating of gold on each side. This is not sufficient to spread the current creating local hot spots and undesirable wave length shifts. In order to spread the current density evenly across the surface of the diodes it is imperative that enough metal is on each diode surface. Thus additional thickness (at least 0.0001" but preferably 0.0005"–0.001") is needed. This may be provided at the wafer level (pre-dice) by electrolytic, electroless, evaporation, sputtering, CVD, MOCVD, MBF, etc. means. In the preferable embodiment low stress copper (Selerex, Enthone Corp., CT, U.S.A.) electrolytic sulfate bath is employed by dipping assembly 1600 that is "shorted" with a clip 1605 contacting both sides into the electrolytic bath 1601. This material is offered by way of example not limitation. A current carrying wire 1602 is attached to it and another wire 1604 to a copper bar 1603. Both wires are then attached to al power supply 1604. Electroless copper can also be used, as well as electroless nickel (AnBel, OIT, Inc., Conn., U.S.A.) or "drop-out" silver (Peacock Labs, Philadelphia, Pa.). The importance of thickness and low stress cannot be overemphasized!

Figure 17:
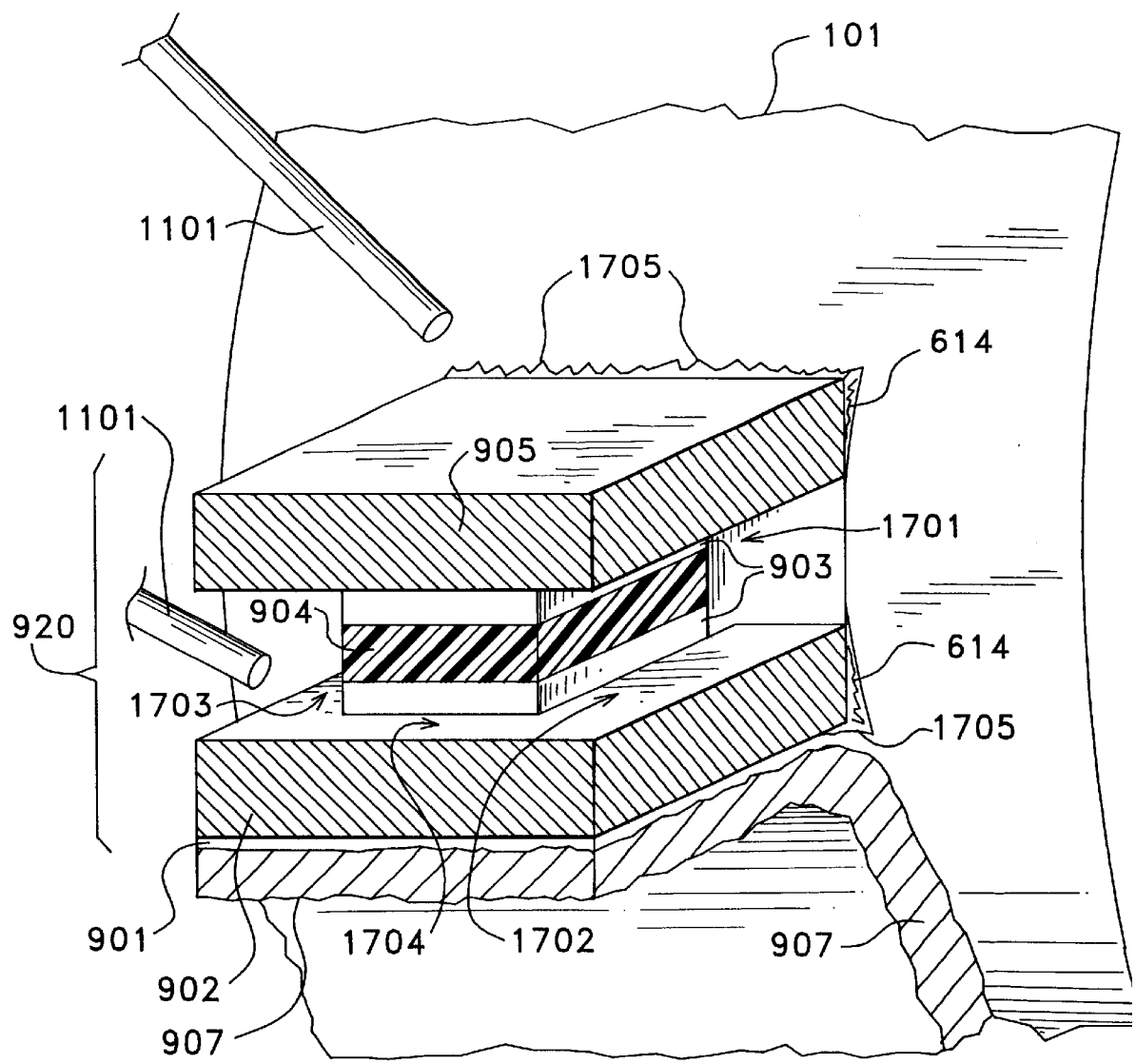
FIG. 17 is a detail drawing of the termination electrode in the preferred embodiment.

FIG. 17 is a detail drawing of the termination electrode in the preferred embodiment. The drawing is not to scale as to amplify the unique aspects of this invention. The electrode assembly 920 is a sandwich of copper foil conductors 902 and 905, adhesive layers 903 and Pyralex™ (P/N LF7021 Dupont, Wilmington, Del. USA) dielectric film insulator 904. Copper is offered by way of example and not limitation. Other suitable materials such as Silver, or alloys may be used. The dielectric film with adhesive is offered by way of example and not limitation. Electrode sandwich 920 is inserted in to end caps 200 and 220 slots 204 (Not shown). Electrode assembly 920 provides terminations for connection to external power source (not shown) and to the conductive films 901 and 907 wrapped around the laser rod 101. Another unique aspect of this invention is the capillary channel(s) 1701–1704 formed by the smaller insulator 904 and larger foils 902 and 905. In the preferred embodiment insulator 904 is cut 0.002" smaller that the top and bottom foils 902 and 905. This is offered by way of example and not limitation, this dimension may change to accommodate variations in adhesive viscosity or assembly temperatures. Small amounts of optical adhesive UV OP30 or UV OP40 (Dymax, New Haven, Conn.) are applied to capillary channels 1701 and 1703 (the intersection of the groove(s) 204 and electrode 920). Adhesive is applied with an ultra-fine Polyimide-(Kapton) (H V Technology 490 US Highway. 11, Trenton, Ga.) capillary tube 1101 (SEE FIG. 11). The capillary action "wicks" adhesive up to the laser rod 101 surface forming small beads 614. If required additional adhesive may be applied as drops or a continuous bead along electrode-rod interface 1705. Positive electrode 902 makes ohmic contact to films 901 and 907 (applied in subsequent steps) ultimately terminating at diode bar 102 anode (not shown) in subsequent processes taught in FIG. 9, 13 and 16. Likewise copper electrode 905 makes ohmic contact to films 901 and 907 (not shown) ultimately terminating at diode 106 cathode. Thus competing the radial diode connection(s) about the laser rod. The clever end cap design allows easy insertion and proper alignment of the electrode to the rod. End caps provide mechanical support as well as an adhesive capillary path. Also providing electrical connection for the optional plating process taught in FIG. 16. This unique electrode design provides ease of assembly, low impedance, and reliable connection to the film conductor.

Figure 18:
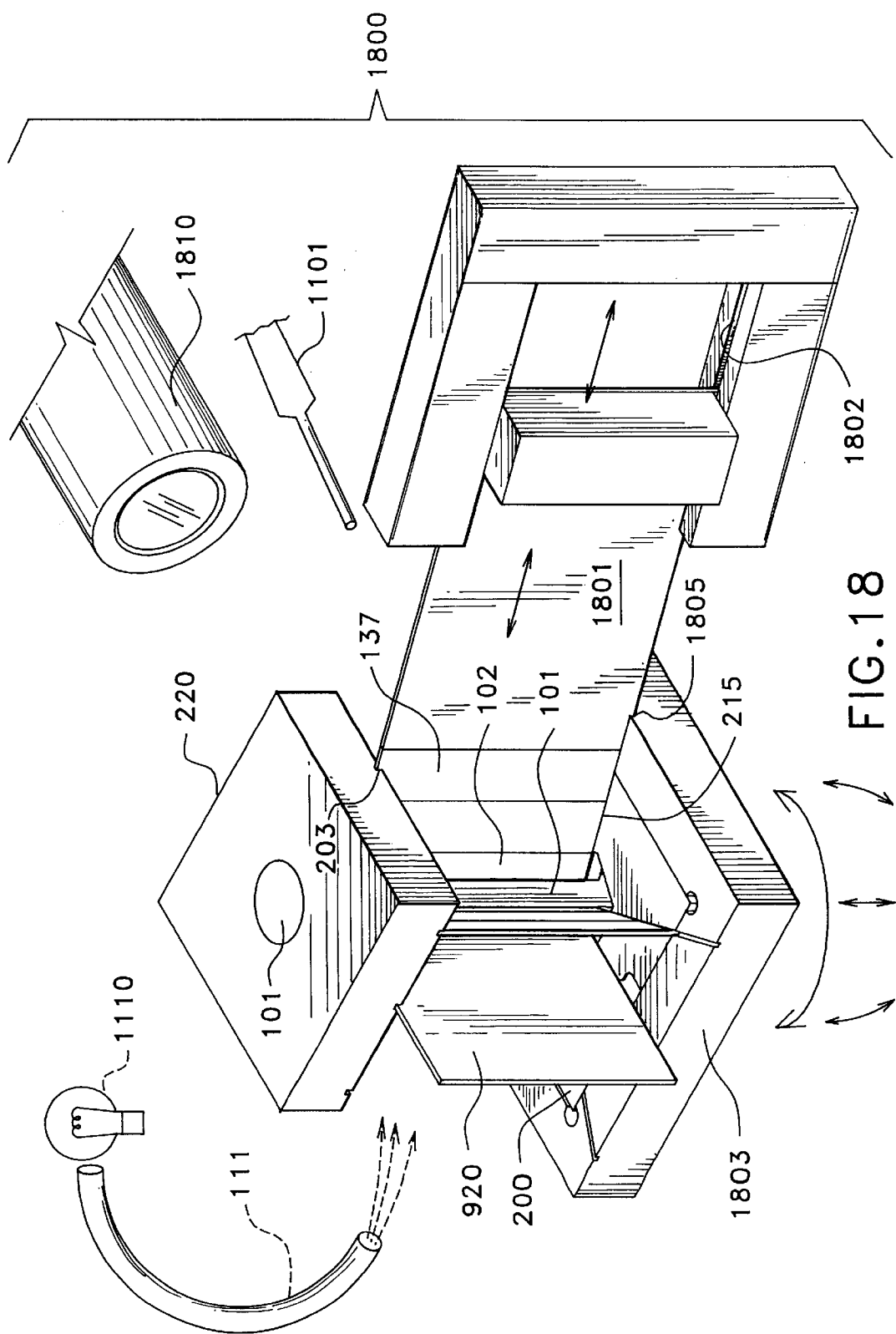
FIG. 18 is a schematic view of the diode bar insertion fixture.

FIG. 18 is a schematic view of the insertion fixture. The diode loading fixture 1800 is used to assist in the loading of the diodes and insulators (dummy diodes) into the partially assembled laser (end pieces 200 and 220 and rod 101). The loading fixture is basically a rigid miniature diving board 1801 that slides back and forth in a race 1802. The partially assembled laser is mounted in a six or seven axis stage 1803 that accepts with diode-accepting groove(s) 1805. Aligns exactly to position in space so that the diode(s) bar 102 is on the edge of the board. The board is then slid forward so that the diode slides into grooves 215–219 and 215A–219A (not shown, see FIG. 2) against the laser rod 101. Additionally, electrode 920 is then slid forward so that it slides into position against the laser rod 101. The board is slightly shorter than the length of the diode so that it "clears" the end pieces 200 and 220 as it is slid between them. This procedure can be automated in a robotic process that uses "machine vision" to locate the Cartesian coordinates of the acceptance slot(s) 203 in the end pieces. Adhesive is applied with special applicator 1101(FIG. 11) as taught in FIG. 6 and 9. Adhesive application can be automated in a robotic process that uses "machine vision" 1810 to locate the various adhesive applications coordinates. UV adhesive curing maybe similarly automated in a robotic process that uses "machine vision" to guide UV source 1110 fiber 1111 to the previously applied adhesive coordinates. Either the board 1801 (with the part to be inserted) or the laser subassembly or both, are moved by motorized computer controlled positioning stages and the parts are brought together. Thereby engaging the diode(s) 102–106 and diode spacers 107–111 (dummy diode) and masking spacers 137 in the slot and it is slid up mating parts. If a semi-automated system is used, an operator may view the slot in both end pieces at the same time through the use of a 3D endoscope or 3D monoscope 1810, available from Metron Optics (Solana Beach, Calif.). Being able to see both slots 203 and 1803 at the same time allows for simplified alignment to the diode on the "board".

Figure 19:
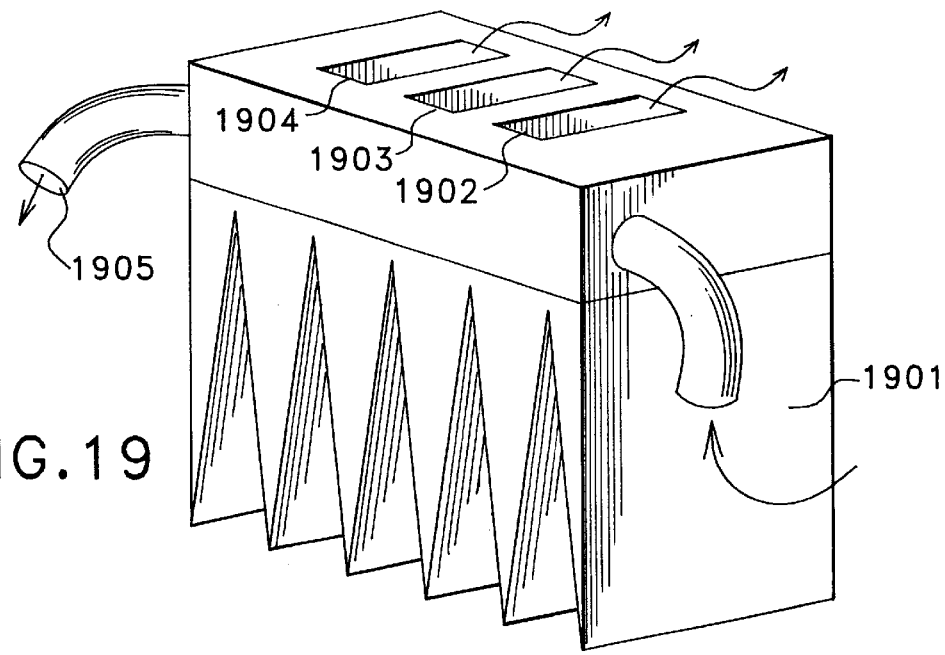
FIG. 19 is an embodiment employing nano particles to cool laser module(s).

FIG. 19 is an embodiment using nano particles to cool laser modules. As taught in FIG. 6 nano particles in the range of 10 nm preferably <5 nm are used with the micro channels to enhance cooling. In the preferred embodiment laser source(s) made by Optopower (Tucson, Ariz.) are chilled by coolant 1905 with nano particles. This manufacture is offered by way of example as, other laser manufactures such as SLI (Binghamton, N.Y.), and Coherent (Santa Clara, Calif.) offer substantially equivalent products. Individual diode(s) 1904, bar(s) 1903, or arrays 1902 may be attached to heat exchanger 1901. Laser manufactures offer products with integral cooling ports in which coolant with nano particles is circulated. In the preferred embodiment approximately 10% ethylene glycol is added to help keep the nano particles in suspension.

FIG. 20 is a detail view of the alternate heat exchanger cooling port interface. The inserts are potted in place with a UV/heat curable epoxy 2004. It is important to use low CTE adhesive to try to best match the thermal expansion coefficients of the diodes and laser rods. A glass filled epoxy available from EMI (Breckenridge, Colo.) with part #3410 has a CTE of around 15 ppm. The heat cure agent assures that UV shadowed areas may be cured with heat. This is offered by way of example and not limitation. Bottom coolant ports 207A and 208A are plugged with blocks 210–211 and glued in to place. In the preferred embodiment caps 200 and 220 are fabricated from Celazole manufactured by Boedeker (Shiner, Tex. USA) or 50/30 Glass filled Torlon™. This material is offered by way of example and not a limitation as other materials are substantially equivalent properties and will perform similarly. Laminated Teflon/stainless steel/polyurethane tube(s) 290 available (H V Technology 490 US Highway 11, Trenton, Ga.) are inserted and glued into ports 208 and 207. Other tubing materials may be used, this is offered by way of example and not limitation. The plugs may be reversed or replaced with tube 209 to achieve higher coolant flow rates. The instant invention allows ease of assembly, precise component alignment, minimal part count and high cooling efficiency. Yielding a robust compact design. Unique manufacturing methods produces high yields and excellent repeatability. Many assembly steps maybe easily automated, further enhancing repeatability and reducing costs.

Figure 20A:
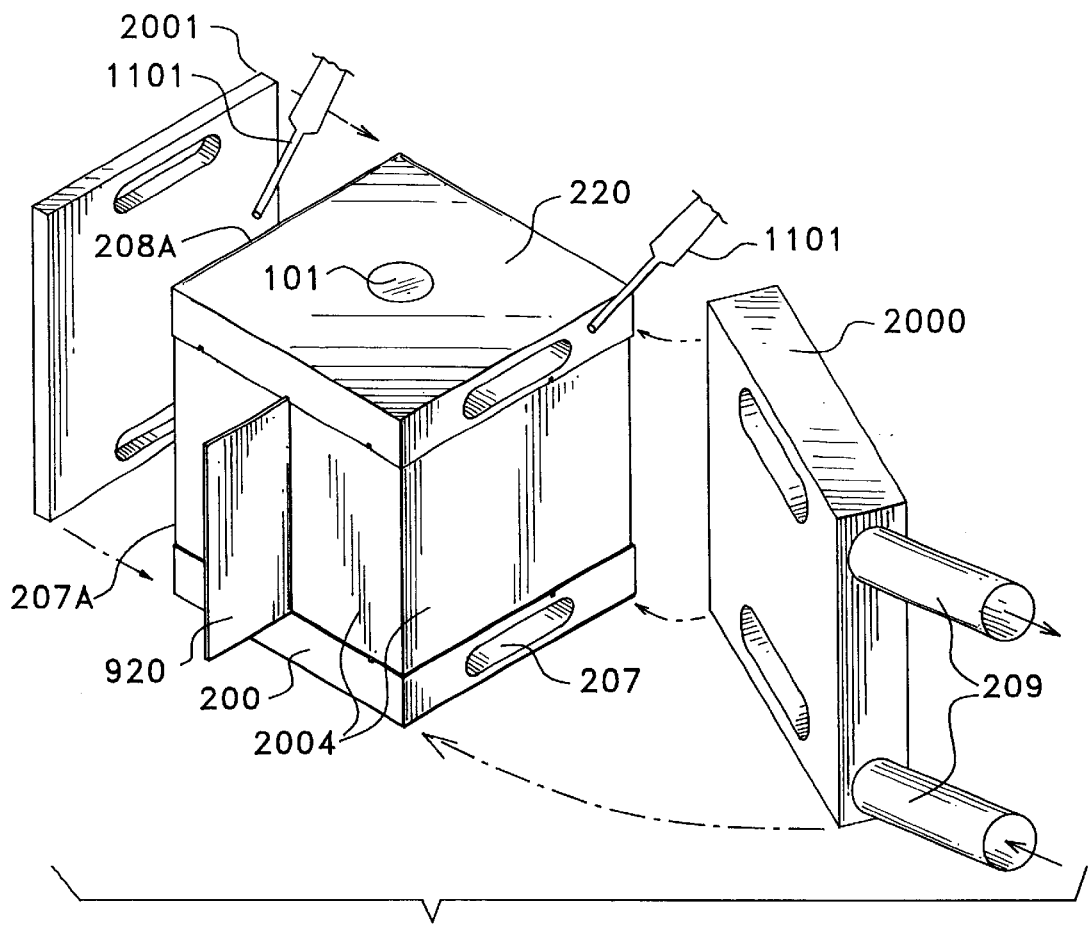
FIG. 20A is an alternate cooling port embodiment.

FIG. 20A is an alternate coolant port embodiment. The inserts are potted in place with a UV/heat curable epoxy. It is important to use low CTE adhesive to try to best match the thermal expansion coefficients of the diodes and laser rods. After laser assembly is potted with glass filled epoxy #3410 available from EMI (Breckenridge, Colo.) having a CTE of around 15 ppm. The heat cure agent assures that UV shadowed areas may be cured with heat. This is offered by way of example and not limitation. Bottom coolant ports 207A and 208A are plugged with port cap 2001 and glued in to place. Port 2000 is glued to coolant ports 207–208 and end caps 200 and 220 respectively. Caps 2000 and 2001 are fabricated from brass, other materials may be used this is offered by way of example and not limitation. Laminated Teflon/stainless steel/polyurethane tube(s) 290 from H V Technology (490 US Highway 11, Trenton, Ga.) are inserted and glued into ports 2003 and 2002. Other tubing materials may be used, this is offered by way of example and not limitation. The instant invention allows ease of assembly, precise component alignment, minimal part count and high cooling efficiency. Yielding a robust, extremely compact design with very high power densities. With unique manufacturing methods high yields and excellent repeatability are achieved. Many assembly steps maybe easily automated, further enhancing repeatability and reducing costs.

Figure 21:
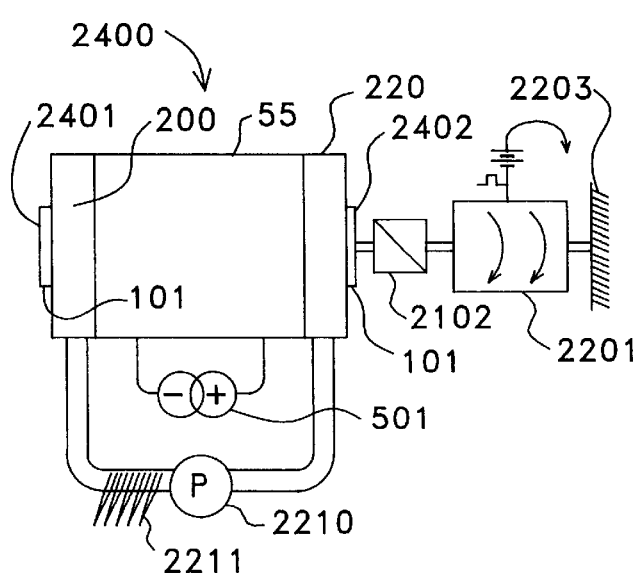
FIG. 21 is a cavity dumped embodiment showing gallium aresenide pulser and RTA pockels cell.

FIG. 21 is an alternate laser embodiment. In this case the rod is fabricated as taught in FIG. 25. Yb:YALO may still be used for side pumping the rod 101 so long as it oriented parallel to the a-axis. These materials may be used to form a self Q-switched laser as they normally absorb output light in the unpumped regions. However, these regions "bleach" at 2 to 3 kw/cm3 thus making possible a passive absorbing Q-switch. Diffusion bonded ends of undoped material may be used for Yb:YALO (Nd:YALO could also be considered). Surfaces 2401 and 2203 are 100% mirrored. Surface 2402 is AR coated. Polarizer 2102 is inserted in the cavity path. The short cavity length's possible with the instant invention are advantageous for pulsed solid-state laser application. Cavity may be "dumped" by an pockels cell 2102 is preferably RTA (available from Crystal Assoc., Warwick, N.J.) BBO could also be used. It is available from Casix Inc., Pasadena, Calif.). If CdTe or other electro-optic or photo refractive material is used in the passive switch or the multi-layer electrically tunable switch these films can best be applies using Ion Beam Sputtering.

FIG. 22 is another alternate embodiment to the high power laser. Multiple diode pump assemblies 2203–2205 are fabricated on a single long rod 90. The fabrication process is the same as taught in FIG. 1, 3 or 4. With the exception of the "cage" fixture 1400 is longer to accommodate the number of pumps. One gauge block 1800 is required for each source. With adjacent end caps many 200 and 220 bonded to each other. Many different materials may be considered for the gain medium 90. Naturally birefringent materials such as YALO or YLF afford the opportunity to primarily only correct thermal lensing aberrations. Of all aberrations these are insist to correct. In fact they may be corrected with an aspheric surface 1203 in the cavity. This surface may be a "replicated" asphere. These aspheres are available from RPC Inc. (Rochester, N.Y.) and Ventura Optical Inc.(Ventura, Calif.). This replicated asphere may be of a highly reflective nature and be placed on one end of the laser rod so that it is both a cavity reflector and aberration corrector. The aspheric may also be ground or polished or etched on the end of the rod 90. It may also be a separate surface that is glued or optically contacted onto the end of the rod. It may also be a separate surface like a lens or an external mirror 1203 in the cavity. The laser rod 90 may also be composed of a glass that is doped with a rare earth material such as Yb, Nd, Gd, Er, etc. In the preferable embodiment the glass rod is only doped in the central approximately $\frac{1}{5}$–$\frac{1}{3}$ of its cross section. This is to say that only the "core" is doped. This is accomplished using the optical fiber drawing technique, but instead of drawing the fiber down to 125 micron diameter it is drawn to about 1–3 mm diameter.

FIG. 23 is an alternate embodiment employing multiple laser modules to achieve higher powers. Hybrid laser 2300 employs multiple lasers 2304–2306 in a linear array. Three lasers 55 are used in the preferred embodiment are offered by way of example and not limitation. Lasers 2304–2306 are fabricated as taught in FIG. 1, are arranged such that the center 609 of each rod 101 is in alignment. Surface 2301 is coated for 100% reflectivity. Surfaces 2302 and 2303 are coated with an appropriate AR (anti reflective coating(s)). Additionally optical adhesive may be applied to surfaces 2302 and 2303 to bond the assembly and reduce refection. In the preferred embodiment cavity may be "dumped" by an electrically tunable multilayer interference filter or photonic crystal 1202 as taught in FIG. 12. Additionally surface 2301 may be fitted with an asphere also taught in FIG. 12. Lasers maybe driven by individual sources 501 or may be arranged in a series or parallel configuration and driven by a single source. Thus greater powers may be realized by stacking the compact cubes.

Figure 24:
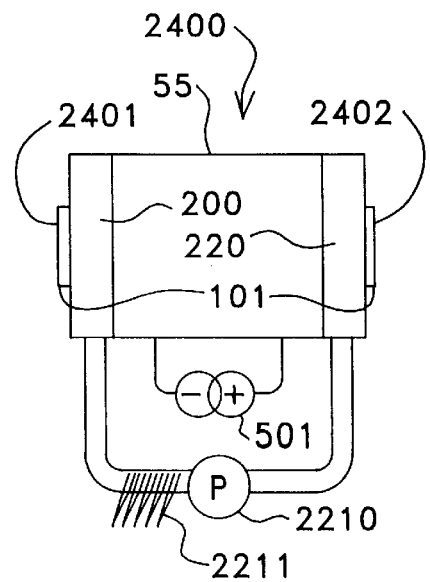
FIG. 24 is a pump head with anti reflective coating on rod ends.

FIG. 24 is a pump head with anti-reflective coating on rod ends. FIG. 24 is an alternate embodiment to FIG. 12. Lasers 55 are fabricated as taught in FIG. 1. Rod 101 appropriate AR (anti reflective) coating is applied to surfaces 2401–2402. Pump is driven by sources 501. Cooling is accomplished with heat exchanger 2211 and circulating pump 2210. In this way the pump 2400 is inserted in to a external cavity.

FIG. 25 Is a schematic view of the preferred rod construction. In the preferred embodiment the rod 101 diameter is 2 mm with a length of 13 mm. Toped core 91 is less than 500 microns. By using 13 mm or shorter rods it is easier to get single longitudinal mode output from the laser $Tm_{00}$. The smaller doped core makes it easier to achieve single transverse mode output. The refractive index difference between the core 91 and the clad 92 may be equal or slightly different. Such as the core might be slightly higher than the clad for an index guiding effect of the laser mode. It may also be the reverse such that these would be some coupling out of the laser mode resulting in a less mechanism for the higher order modes. The difference in refractive indexes could also be used to create some diffraction effects to create in loss mechanism. The refractive index difference could also be used to more strongly focus the pump 114 light into the center of the core. The glass may be phosphate, silicate, borophosphate, fluoride, fluoroborate or combinations there of. The doped phosphate laser rods are available from Kigre Corp. (Hilton Head, S.C.) and the silicate rods are available from Schott Glass Corp (Pittsburgh, Pa.). Crystal fibers may also be considered such as single crystal fiber or polycrystalline fibers. Additionally, glass fibers with crystallites may be used. The advantage here is that higher rare earth doping concentrations are possible thereby increasing the "gain length" of the laser and making it more beneficial to amplifier application. The single best reason for using a rod with a centrally doped core is that no pump light is "wasted" by using absorbed in the peripheral annulus of the rod where it does little more then produce wasted heat.

FIG. 26 is a alternate laser embodiment using an aspheric lens with passive Q-switching. In this embodiment rod 101 is constructed as taught in FIG. 25. In the preferred embodiment aspheric lens 1201 with 100% reflective coating is bonded to rod 100. FIG. 22 discuses aspheric correction in further detail. Alternately the rod may be simply 100% mirrored to allow correction inside the cavity by the user.

Short cavity length's possible with the instant invention, are desirable for many pulsed solid-state laser application. Passive "Cavity dumping" the laser is desirable as it eliminate the expensive pulse generator 1203 used in FIG. 12. The cavity is "dumped" by an nonlinear crystal 2601. Laser is cavity dumped or q-switched when the circulating power in the cavity reaches a threshold allowing photons to escape aperture 2602. Using a voltage pulser 1203 a Fast Ionization Dynistor or other gallium arsenide based require fast rise time voltage pulser 1203 could be used. The Fast Ionization Dynister is available from Mega Pulse, Inc. (Alexandria, Va.). If CdTe or other electro-optic or photo refractive material is used in the alternate embodiment passive switch or the multi-layer electrically tunable switch these films can best be applies using Ion Beam Sputtering. The replicated asphere corrects for "thermal" distortion thus reducing beam diameter and improving M2.

Although the present invention has been described with reference to preferred embodiments, numerous modifications and variations can be made and still the result will come within the scope of the invention. No limitation with respect to the specific embodiments disclosed herein is intended or should be inferred.

I claim:

1. A laser device including:
   a laser rod;
   a plurality of discreet conductive ring segments surrounding said laser rod;
   said ring segments each having a laser diode;
   said ring segments and said laser diodes together forming a series path for electric current around all of said ring segments; and
   a cooling fluid in a channel in fluid communication with said rod and said laser diodes.

2. The laser device of claim 1, wherein the channel further comprises a plurality of solid spheres, thereby providing a more efficient heat transfer from the laser diodes through the channel.

3. The laser device of claim 1, wherein each laser diode has a physical interface with the rod.

4. The laser device of claim 3, wherein the physical interface is an optical adhesive.

5. A laser device including:
   a laser rod;
   a plurality of discreet conductive ring segments surrounding said laser rod;
   said ring segments forming a ring around the laser rod;
   said ring segments each having a laser diode;
   said ring segments and said laser diodes together forming a conductive path for electric current around all of said ring segments; and
   a cooling fluid in a channel in fluid communication with said rod and said laser diodes.

6. A laser device including:
   a laser rod;
   a plurality of discreet conductive ring segments surrounding said laser rod;
   said ring segments forming a solid three dimensional ring around the laser rod;
   at least one ring segment having a laser diode;
   said ring segments and said laser diode together forming a conductive path for electric current around all of said ring segments; and
   a cooling fluid in a channel in fluid communication with said rod and said diode lasers.

7. A laser device including:

a laser rod;

a plurality of discrete conductive ring segments surrounding said laser rod, each of said ring segments separated from the next ring segment by a radial diode space;

a laser diode in each of said radial diode spaces;

said ring segments and said laser diodes together forming a path for electric current around said laser rod in which each of said laser diodes carries all of said current, and none of said current is shunted around any of said laser diodes; and said ring segments and said laser diodes form a rod coolant channel wherein at least one said ring segment contains at least one coolant channel in fluid communication with said rod coolant channel.

8. A laser device including:

laser rod means for amplifying a laser beam;

means for mounting a laser diode radially around the laser rod means;

said means for mounting a laser diode further comprising a ring segment having a fluid path therein;

a laser diode mounted in the means for mounting a laser diode; and means for cooling said laser diode, said laser rod means; and said means for mounting a laser diode functioning to provide a fluid loop around all elements.

9. The laser device of claim 8, wherein the means for cooling said laser diode further comprises at least one fluid path adjacent the laser rod and the laser diode radially aligned therewith.

10. A laser diode device including:

laser rod means for amplifying a laser beam;

means for mounting a laser diode radially in close proximity to the laser rod means;

said means for mounting a laser diode comprising a ring segment having a fluid path therein;

a laser diode mounted in the means for mounting a laser diode;

a common fluid channel means outside the laser rod functioning to cool the laser rod, the ring segment and the laser diode.

11. The laser diode device of claim 10, wherein the laser diode has a physical contact with the laser rod means.

* * * * *